(12) United States Patent
Huff

(10) Patent No.: US 8,304,324 B2
(45) Date of Patent: Nov. 6, 2012

(54) LOW-TEMPERATURE WAFER BONDING OF SEMICONDUCTORS TO METALS

(75) Inventor: Michael Huff, Oakton, VA (US)

(73) Assignee: Corporation for National Research Initiatives, Reston, VA (US)

( * ) Notice: Subject to any disclaimer, the term of this patent is extended or adjusted under 35 U.S.C. 154(b) by 1080 days.

(21) Appl. No.: 12/232,657

(22) Filed: Sep. 22, 2008

(65) Prior Publication Data

US 2009/0286382 A1      Nov. 19, 2009

Related U.S. Application Data

(60) Provisional application No. 61/071,776, filed on May 16, 2008.

(51) Int. Cl.
*H01L 31/00* (2006.01)
(52) U.S. Cl. .................. 438/458; 438/406; 438/455
(58) Field of Classification Search ........... 438/455–459
See application file for complete search history.

(56) References Cited

U.S. PATENT DOCUMENTS

| | | |
|---|---|---|
| 6,606,251 B1 | 8/2003 | Kenny et al. |
| 2003/0142712 A1 | 7/2003 | Ikeda et al. |
| 2005/0074041 A1 | 4/2005 | Sommerer et al. |
| 2006/0160330 A1 | 7/2006 | Kobayashi et al. |
| 2009/0092162 A1 * | 4/2009 | Huff et al. ............... 372/36 |

OTHER PUBLICATIONS

Office Action mail date Aug. 27, 2010 U.S. Appl. No. 12/232,655, filed Sep. 22, 2008.
Office Action, mailed Apr. 13, 2011 in U.S. Appl. No. 12/232,655, filed Sep. 22, 2008.
Final Office Action, mailed Oct. 26, 2011 in U.S. Appl. No. 12/232,655, filed Sep. 22, 2008.

* cited by examiner

*Primary Examiner* — Dung A. Le
(74) *Attorney, Agent, or Firm* — Nixon & Vanderhye P.C.

(57) ABSTRACT

A method of wafer or substrate bonding a substrate made of a semiconductor material with a substrate made from a metallic material is disclosed. The method allows the bonding of the two substrates together without the use of any intermediate joining gluing, or solder layer(s) between the two substrates. The method allows the moderate or low temperature bonding of the metal and semiconductor substrates, combined with methods to modify the materials so as to enable low electrical resistance interfaces to be realized between the bonded substrates, and also combined with methods to obtain a low thermal resistance interface between the bonded substrates, thereby enabling various useful improvements for fabrication, packaging and manufacturing of semiconductor devices and systems.

161 Claims, 17 Drawing Sheets

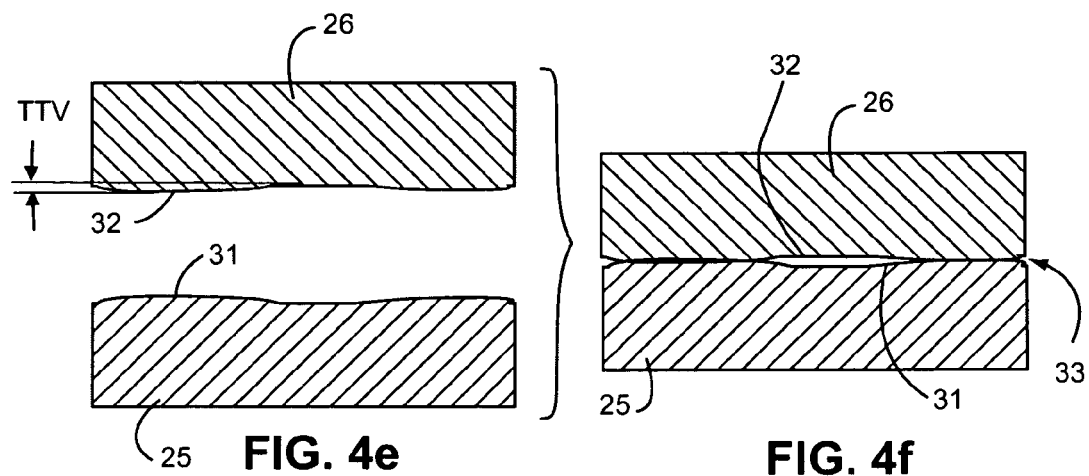
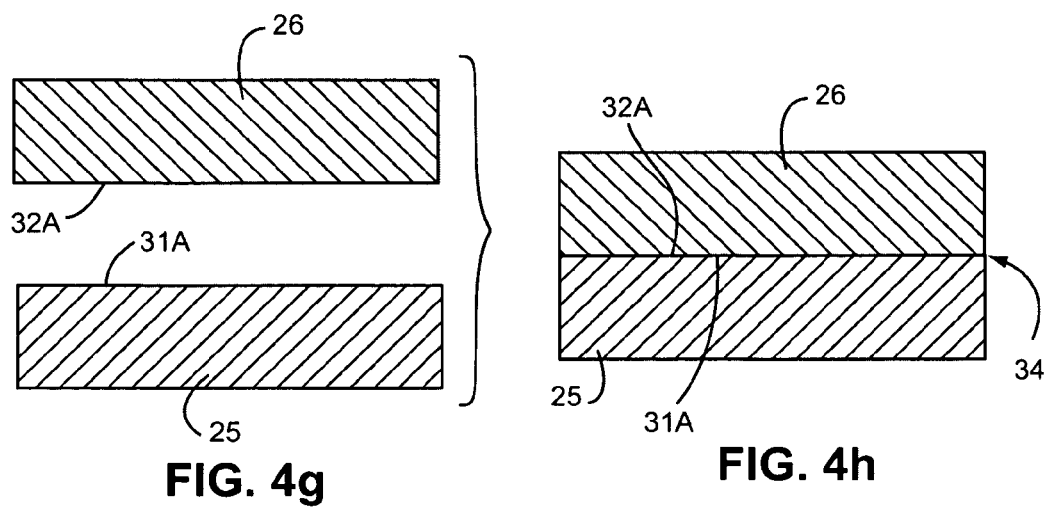

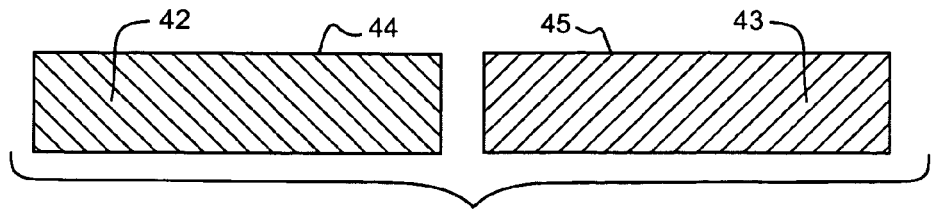
FIG. 8a
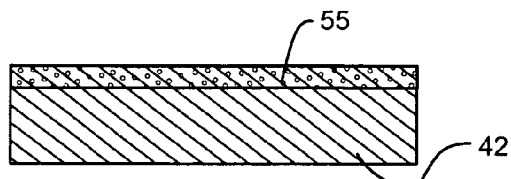
FIG. 8b
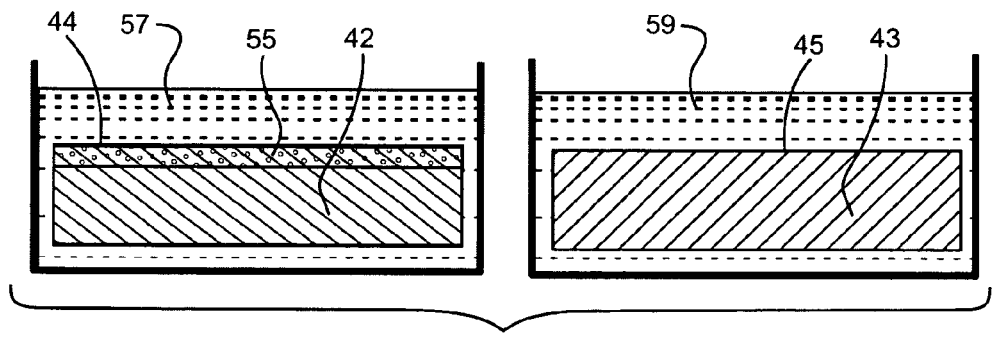
FIG. 8c
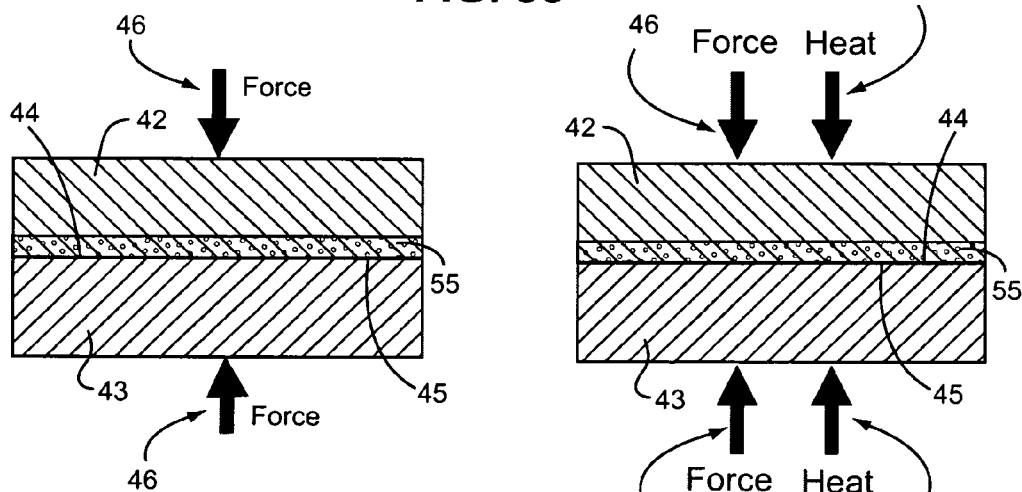
FIG. 8d
FIG. 8e

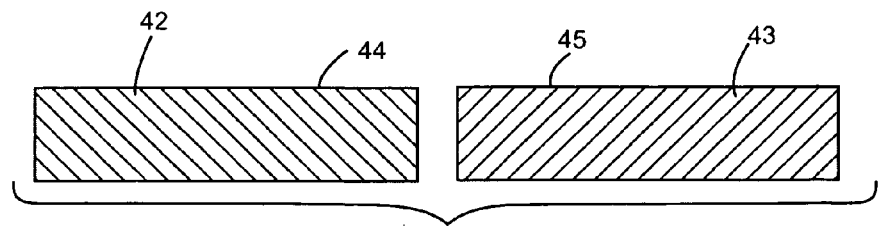
FIG. 12a
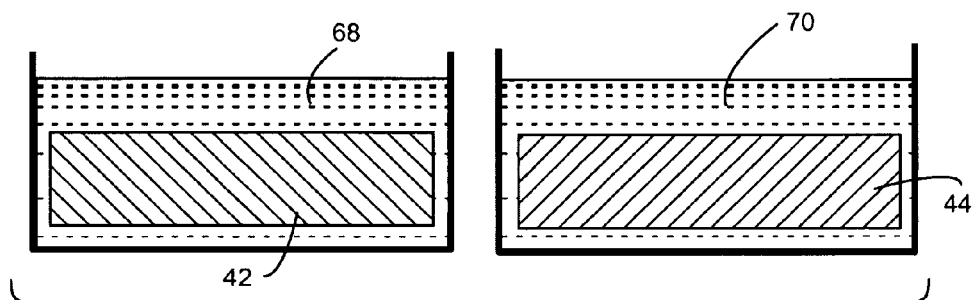
FIG. 12b
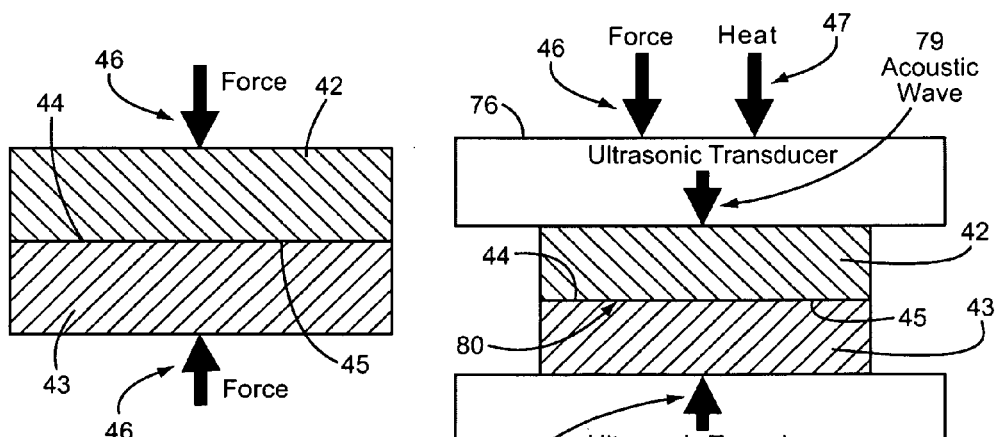
FIG. 12c
FIG. 12d

LOW-TEMPERATURE WAFER BONDING OF SEMICONDUCTORS TO METALS

CROSS REFERENCE TO RELATED APPLICATION

This application claims the benefit of Provisional Application No. 61/071,776, filed May 16, 2008, the entire contents of which are hereby incorporated by reference in this application.

BACKGROUND OF THE INVENTION

Field of Invention

The present invention relates generally to the bonding of substrates, and more specifically, to the wafer or substrate bonding of a substrate made of a semiconductor material to a substrate made from a metallic material.

BACKGROUND OF THE INVENTION

The joining together of semiconductor substrates to metallic substrates has been practiced in the micro-fabrication technology domain for several decades, and more recently, in the nano-fabrication domain. But it has always involved the use of an intermediate layer of a solder, adhesive, epoxy, glass frit, or other joining material or compound between the two substrates to provide sufficient adhesive strength for practical applications. Metal and semiconductor substrates have been joined together for one or more purposes. First, it can provide increased mechanical stiffness and strength to a fragile semiconductor substrate, thereby making the semiconductor less susceptible to breakage during normal handling, as well as during subsequent fabrication and packaging processes. Second, it can provide electrical connection(s) to a semiconductor substrate by which current and/or voltage can be applied to operate the device(s). Third, it can provide the ability to move heat away from the semiconductor device where the metal substrate functions as a thermal heat sink or thermal heat spreader to the semiconductor device, thereby enabling the temperature of the semiconductor device to be better regulated or maintained at acceptable levels during operation. Fourth, it can provide electromagnetic shielding of devices made in the semiconductor substrate, to thereby reduce interference from nearby Alternating Current (AC), Radio Frequency (RF) and microwave (mm-wave) sources, by enclosing, either partially or entirely, the semiconductor devices by conductive metal materials. Fifth, it can facilitate the packaging of the semiconductor device(s). In most cases, the package for semiconductors is made from a metal, plastic or ceramic material or some combination of material types and the semiconductor substrate is mated to the die attachment area in the package where a metal material may be located. This metal can be a fundamental portion of the package housing or it may be a thin- or thick-film of metal deposited and suitably patterned within the package. In nearly all circumstances, the attachment of the semiconductor substrate to the package is performed using either a solder or a gluing agent such as epoxy.

Despite the reasons and merits of joining a semiconductor substrate to a metallic substrate for many applications, it is understood and recognized that the use of an intermediate layer or layers between a metal substrate and a semiconductor substrate to mate the two substrates to one another has many disadvantages and shortcomings.

Intermediate layers, such as solders, epoxies, glass frits, adhesives and the like, that are commonly used for joining a semiconductor and metal substrate together can result in large "built-in" residual stresses that can have detrimental effects on semiconductor device performance. For example, if a soldering material is used to mate a semiconductor to a metal substrate, the temperature of the mating process must be performed at approximately the melting or alloying temperature of the soldering material, which is typically well over one-hundred degrees Celsius. Metals usually have relatively large coefficients of thermal expansion whereas semiconductors have comparatively lower coefficients of thermal expansion, and therefore the differing thermal expansion coefficients of the materials in this system combined with the elevated temperatures required to perform the soldering process can result in large built-in stresses between the mated substrates once they are cooled to room temperature.

Built-in stresses frequently result in many negative consequences for the performance of semiconductor device(s). For example, it is well known that most semiconductors can have their bandgaps and energy levels modified by the application of mechanical strains on the substrate material due to the piezoresistive effect in semiconductors. Consequently, if the mating process results in built-in stresses, these built-in stresses can cause the bandgaps and energy states in the semiconductor material to be altered, thereby modifying the device behavior such as changing the threshold voltages in transistors or shifting the wavelength of the radiation for solid-state light emitting devices.

Large built-in stresses have also been known to appreciably lower the reliability of semiconductor devices. For example, semiconductor devices frequently heat-up due to the power dissipated during operation, thereby resulting in large thermal stresses developing between the mated materials. This thermal stress can be due to the differing thermal expansion coefficients of the materials used in these systems in which metals typically have larger coefficients of thermal expansion than semiconductors. Under some circumstances, this thermal stress can become sufficiently large so as to result in the fracture of the semiconductor substrate, thereby resulting in an inoperable semiconductor device(s). Additionally, a sufficiently large thermal stress between a joined semiconductor and metal substrate can result in the substrates breaking apart due to a failure at the interface. Moreover, even if the thermal stress is not sufficient large to cause fracture in one operational cycle, fracture can still result after many operational cycles (e.g., power on for some period of time with a resultant increase in heating and thermal stress, followed by a period of time with the power off and a decrease in heating and thermal stress, followed by a period of time with power on again with a resultant increase in heating and thermal stress, etc.), due to fatigue effects in the semiconductor substrate over several repeated cycles of operation.

Additionally, the solders used to join metals to semiconductors can re-flow from the interface to other areas of the device and/or package, which can result in a number of problems, such as the electrical shorting of the device. For example, semiconductor devices typically heat up during operation and this elevated temperature, possibly combined with the stresses that the solder is exposed to (due to the different coefficients of thermal expansion of the materials used in the system) and the favorable wetting properties of the solder on the semiconductor and metal substrates, can cause the solder to partly or completely melt and re-flow to other areas of the device or package, or both. In some instances, this solder may re-flow to locations that cause an electrical shorting between parts of the device meant to be electronically isolated, thereby resulting in catastrophic failure of the device.

Alternatively, or in addition to these phenomena, the intermediate layer(s) used for joining metals to semiconductors under operational conditions can re-flow away from the areas where electrical current is flowing or a voltage potential is applied, thereby resulting in an open circuit condition as well as other serious and negative effects on the semiconductor device(s).

Similarly, if the solder re-flows from the interface between the metal and semiconductor substrates, the result will be an increase in the thermal resistance at the location where the solder is no longer present. As a result, the semiconductor's temperature will rise, since the heat cannot be transferred away from the semiconductor as effectively when the solder is present. Thereupon, the interface temperature will continue to rise, thereby causing more solder to re-flow, and so on. Consequently, a positive feedback process loop is established in which the semiconductor heating reinforces the solder migration, which causes an additional temperature rise in the semiconductor, and so on, with the eventuality that the semiconductor fails to operate.

For some semiconductor devices, even for relatively small temperature increases (e.g., a few degrees Celsius), there can be a very large decrease in device reliability. Therefore, any phenomena resulting in a slight over-temperature of the semiconductor devices can have significant and negative effects on the semiconductor device reliability.

Additionally, the soldering processes typically use a flux material to facilitate the soldering. Flux material mixtures are highly corrosive, and as a by-product of the soldering process, some residual flux will be left remaining on the surfaces after the joining process has been completed, and can therefore have a negative effect on the semiconductor device and/or the metal substrate.

The use of epoxies and other gluing agents also has many disadvantages for the mating of semiconductor devices to metal substrates. Most epoxies and glues are in a liquefied form to facilitate the dispensing of these agents onto the substrates to be mated. Subsequently, after spreading the epoxy or glues onto the surfaces to be joined and physically contacting them, the epoxy or glues are then "cured" whereby the solvents used to liquefy the epoxy or glues are evaporated or driven off, and/or the components within the mixture react so that the epoxy or glue hardens or stiffens. However, during this curing or reacting process, the epoxy or glue undergoes a considerable amount of shrinkage, whereby a large amount of residual stress between the semiconductor and metal substrates results. This residual stress will have similar negative consequences on the semiconductor performance and reliability as a result of the soldering process described above.

Additionally, epoxies and glues typically will display mechanical creep over time. Creep is the plastic deformation of a material that is subjected to a stress below its yield stress and is accelerated at higher temperatures. This creep phenomenon has many deleterious effects such as a constantly changing stress loading on the semiconductor material and device thereby making any schemes employed to reduce, mitigate, and/or compensate these stresses difficult or impossible.

Additionally, the solvents and other components used in the epoxies and glue mixtures will continue to "outgas" from the epoxy or gluing materials for many years into the future even after a thorough "curing" process of these materials. These outgassed substances can have a deleterious effect, such as contamination or corrosion, of the semiconductor device(s).

Consequently, this is an enormous opportunity for a new technique by which a metal substrate can be directly bonded to a semiconductor substrate without an intermediate layer. There is also an enormous opportunity for a new technique in which a metal substrate can be directly bonded to a semiconductor substrate at low temperatures without an intermediate layer.

Direct wafer bonding has been a widely used fabrication technique in the Integrated Circuit (IC) and Micro-Electro-Mechanical Systems (MEMS) technology areas for several years. This technique has been primarily used to bond two silicon wafers together using no adhesives or intermediate layers. Frequently, one of the silicon wafers is oxidized prior to the bonding. On occasion, different types of semiconductors have been direct wafer bonded together as well.

The direct wafer bonding process of semiconductor wafers usually involves a sequence of steps, including cleaning of the wafers, preparation of the wafer surfaces, physical contact of the wafers together, and then followed by a high temperature anneal. The elevated temperature anneal is necessary to increase the bond strength and is typically performed at temperatures at or above 800 degrees Celsius, with temperature at or above 1000 degrees Celsius being the most common.

The high temperatures of the anneal required for direct wafer bonding are problematic for many substrate materials as well as for substrates having electronic, photonic, or MEMS devices made in the semiconductor material since the high annealing temperatures result in a severe degradation of device performance and possibly the complete inability of the device to function. Therefore, any semiconductor-to-semiconductor wafer bonding employed in fabrication of devices is usually performed before any active devices have been implemented in the semiconductor substrates.

Nevertheless, in many applications it is desirable to bond a metal substrate to a semiconductor substrate without the use of an intermediate layer. Furthermore, in some applications is it is not only desirable to bond a metal substrate to a semiconductor substrate without the use of an intermediate layer, but to do so while also obtaining a low electrical resistance pathway from the metal substrate to the semiconductor, as well in the opposite current direction from the semiconductor to the metal substrate. Moreover, in some further applications, it is not only desirable to bond a metal substrate to a semiconductor substrate without the use of an intermediate layer, but to do so while also obtaining a low thermal resistance between the metal substrate and the semiconductor substrate. It is also desirable to perform bonding between a semiconductor substrate and a metal substrate at low-temperatures.

SUMMARY OF THE INVENTION

The present invention relates to a method of wafer or substrate bonding that allows the bonding or joining of two substrates together without the use of any intermediate joining, gluing, or solder layer(s) between the two substrates. The method of the present invention can be used for device fabrication, systems integration, as well as for packaging of devices, and is very useful for many applications, since it can reduce fabrication and packaging complexity and cost for a large and increasing number of MEMS, electronic, and photonic devices and systems. Additionally, the present invention allows the mating of substrates with the purpose of reducing the thermal resistance from a power dissipating semiconductor device(s) (e.g., MEMS, electronic, and/or photonic device(s) or some combination thereof) to the metal substrate that the semiconductor devices(s) are mated to that may be serving as a heat sink, thereby allowing the active device (i.e., MEMS, electronic, and/or photonic device(s)) to be kept at lower operational temperatures for a given power dissipation. The method can also be used to make low electrical resistance contacts between a metal substrate material and a semiconductor substrate material, thereby allowing voltage and/or current to be directly applied to the semiconductor device(s). The method of bonding semiconductor and metal substrates together encompasses methods to increase the reliability and/or power of semiconductor devices, including, but not limited to, silicon switches, integrated circuits, MIcrowave Millimeter Integrated Circuits (MIMICs), light emitting diodes (LEDs), laser diodes, MEMS, power electronics, as well as enabling individual addressability and enhanced operational control of semiconductor devices through the merging of different semiconductor and metal substrates or different material types. The method allows the successful direct bonding of material substrates having different thermal expansion coefficients, and at relatively low temperatures (i.e., approximately 400 degrees Celsius or less). Low-temperature wafer bonding of semiconductors and metals is important due to the possibility of differing thermal expansion coefficients of the substrate materials.

The present invention is directed to a method for bonding a metal substrate to a semiconductor substrate without the use of any intermediate layer(s). The method involves preparing the substrates before bonding so as to increase the bond strength. Additionally, a method to obtain a high-strength bond using a low-temperature anneal is also described. Additionally, the method also involves preparing the substrates before bonding with an oxygen plasma exposure, a Hydrogen plasma exposure, an NH3 plasma exposure, or a suitable combination of gas plasma exposures so as to obtain a high-strength bond using a low-temperature anneal.

The present invention also involves (a) preparing substrate surfaces before bonding so as to obtain low electrical resistance across the bonded interface between the substrates, (b) attaching semiconductor die to metal substrates that can act as heat sinks, passive, or active coolers for the semiconductor devices, (c) bonding a metal to a semiconductor substrate, such that the thermal resistance across the interface between the semiconductor and metal substrates is extremely low, and (d) attaching semiconductor die to metal substrates that can act as heat sinks, passive or active coolers for the semiconductor device(s), as well as make low electrical resistance contact from the metal substrate to the semiconductor device(s).

The present invention further provides a means of packaging semiconductor device(s) without the use of solders, epoxies or gluing agents so as to protect the semiconductor device(s) from the environment.

The present invention also provides a means for bonding a metal substrate to a semiconductor substrate in which the substrates are (a) irradiated with a pulsed laser beam that scans across the surface prior to physical contacting of the substrates (i.e., pre-bonding) or (b) placed in an Ultra-High Vacuum (UHV) chamber and heated to an elevated temperature prior to physical contacting of the substrates (i.e., pre-bonding) to thereby increase the bond strength and quality as well as lower the annealing temperature for the bonding.

The present invention provides a means for low-temperature bonding of a metal substrate to a semiconductor substrate in which the suitably prepared substrates are physically contacted (i.e., pre-bonded) and then the pre-bonded substrate pair is exposed to microwave radiation that selectively heats the metal, but does not appreciably heat the semiconductor, since the semiconductor is transparent (i.e., non-absorbing) at the wavelength of radiation used.

The present invention provides a means for low-temperature bonding of a metal substrate to a semiconductor substrate in which the suitably prepared substrates are physically contacted (i.e., pre-bonded) and then the pre-bonded substrate pair is exposed to ultrasonic acoustical energy to bond the two substrates together at a low temperature.

The present invention also provides a means for bonding a metal substrate to a semiconductor substrate so as to obtain a low electrical resistance across the semiconductor and metal interface in which the pre-bonded substrates have either (a) Boron incorporated into the surface of the materials prior to physical contacting (i.e., pre-bonding) of the substrates, to increase the bond strength and quality, as well as lower the annealing temperature for the bonding, (b) a thin film layer of Palladium deposited on the surface prior to physical contacting (i.e., pre-bonding) to increase the bond strength and quality, obtain a low-resistance electrical contact across the bonded interface, as well as lower the annealing temperature for the bonding, (c) a thin film layer of a metal material deposited on the surface of the semiconductor substrate that is known to form an ohmic contact with the semiconductor material at low temperatures, and that is deposited on the semiconductor surface prior to physical contacting of the substrates (i.e., pre-bonding) to increase the bond strength and quality, as well as lower the annealing temperature for the bonding, (d) degenerately doping the semiconductor substrate with an appropriate dopant material prior to physical contacting (i.e., pre-bonding) to increase the bond strength and quality, obtain a low-resistance electrical contact across the bonded interface, as well as lower the annealing temperature for the bonding, and/or (e) depositing another semiconductor material layer on the semiconductor substrate wherein the deposited semiconductor layer has an electronic bandgap so as to allow a low electrical resistance pathway from the top surface of the deposited semiconductor layer through the semiconductor substrate prior to physical contacting (i.e., pre-bonding) to obtain a low-resistance electrical contact across the bonded interface, as well as potentially lowering the annealing temperature for the bonding. The Boron or other dopants can be introduced into the semiconductor substrate surface using either diffusion or ion implantation.

The present invention further provides a means of bonding (a) various types of different metal substrates with one another, (b) various types of semiconductor substrates of different material types to one another, and (c) various types of metal and semiconductor substrates to one another in any conceivable combination of semiconductor and metal substrate material types with the purpose of merging different technologies (i.e., merge MEMS with microelectronics, merge MEMS with photonics, etc.) together to form multi-technology-based systems.

The present invention also provides a means of attaching microelectronics die or chips to metal substrates used as heat sinks, passive or active coolers, as well as electrodes to make electrical contact to the semiconductor die or chips without the use of any solder, epoxy, or gluing agents, and of attaching microelectronics die or chips to metal substrates, as stated above, so that the thermal resistance across the interface between the metal and microelectronics die or chips is extremely low.

The present invention further provides a means of attaching microelectronics die or chips and other semiconductor die, such as MEMS or photonics die that may be used as part of a system, to the metal substrates used as heat sinks, passive or active coolers, as well as electrodes to make electrical contact to the microelectronics die or chips without the use of any solder, epoxy, or gluing agents so as to form a merged multiple technology system or a packaged semiconductor die.

The present invention also provides a means of attaching microelectronics die or chips and other semiconductor die, such as MEMS or photonics die that may be used as part of a system, to the metal substrates used in packages that function as (a) an electrode to make low resistance electrical contact to the semiconductor die or chips, without the use of any solder, epoxy, or gluing agents so as to form a packaged semiconductor system, (b) a thermal heat sink, without the use of any solder, epoxy, or gluing agents so as to form a packaged semiconductor die, or (c) as an electrode to make low resistance electrical contact to the semiconductor die or chips and also as a thermal heat sink to the semiconductor die or chips, without the use of any solder, epoxy, or gluing agents so as to form a packaged semiconductor system.

Thus, the present invention is directed to a method of direct wafer bonding that allows the moderate or low temperature bonding of heterogeneous materials such as metal substrates to semiconductor substrates, combined with methods to modify the materials so as to enable low electrical resistance (i.e., ohmic) interfaces to be realized between the bonded substrates, and also combined with methods to obtain a low thermal resistance interface between the bonded substrates, thereby enabling various useful improvements for fabrication, packaging and manufacturing of semiconductor devices and systems.

BRIEF DESCRIPTION OF THE DRAWINGS

FIGS. 4(a)-(l) are cross-sectional views of a substrate prior to bonding and illustrating the required elements that need to be met for good bonding to occur, including: the substrates must be sufficiently smooth (FIGS. 4(a)-4(d)); the substrates must be sufficiently flat (FIGS. 4(e)-(h)); and the substrates must be sufficiently clean and free of particulates (FIGS. 4(i)-(l)).

FIGS. 8(a)-(e) are cross-sectional views illustrating a technique for introducing Boron into the surface of a semiconductor as part of the bonding process so as to obtain low electrical and thermal resistance across the bonded interface.

FIGS. 12(a)-(d) are cross-sectional views illustrating a bonding process to bond a semiconductor substrate to a metal substrate whereby ultrasonic acoustical energy is applied to the pre-bonded substrate pair in order to facilitate the bonding process so that bonding can be performed at lower temperatures.

DETAILED DESCRIPTION OF THE INVENTION

The present invention is directed to the bonding of substrates together, where one of the substrates is made of a semiconductor material and the other substrate is made from a metallic material, and where this bonding is achieved without the use of any intermediate joining, gluing, or solder layer(s) between the two substrates. The present invention is an improvement of a previously discovered method that has been generally known as wafer bonding that is used to bond two semiconductor substrates together. The present invention can be used for device fabrication, as well as for packaging of devices, and is very useful for many applications, since it can obtain a lower thermal resistance across heterogeneous material interfaces and/or a low electrical resistance across a metal to semiconductor interface, and it can reduce fabrication and packaging complexity, as well as cost for a large and increasing number of MEMS, electronic, and photonic devices and systems.

Figure 1:
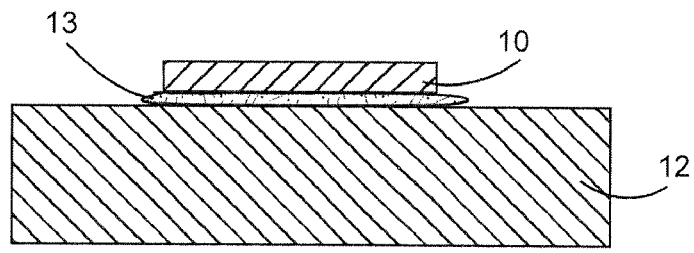
FIG. 1 is a cross-sectional view illustrating the use of a joining material to attach a semiconductor substrate to a metal substrate.

FIG. 1 is an illustration of a commonly used method to join a semiconductor substrate 10 to a metal substrate 12, using an intermediate joining material layer 13, and of the problems and disadvantages of the current approaches for joining metal substrate 12 and semiconductor substrates 10. Specifically, the semiconductor substrate 10 is a conventional wafer, die, chip or similar component and the metal substrate 12 is a shaped piece of material made from an elemental metal, an alloyed metal (e.g., two or more metal types intermixed in a solid phase state), or a composite metal material made of two or more metal material types brought or pressed together to form a metal composite substrate. The intermediate material 13 is used to join the semiconductor 10 and metal substrates 12 together, as shown in FIG. 1. The intermediate material 13 used to join the semiconductor substrate 10 to the metal substrate 12 can be one of several types of materials, such as solder, glass frit, glue, epoxy, or other adhesive materials.

Figure 2A:
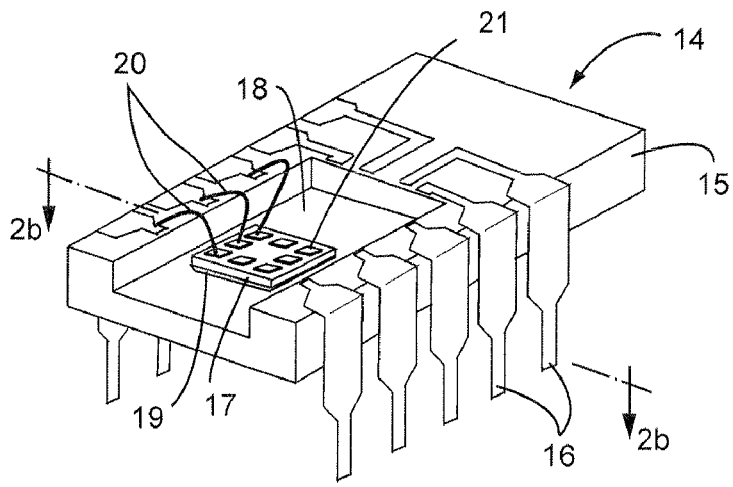
FIG. 2a is an isometric view illustrating the use of a joining material to attach a semiconductor die to the die attach area in a conventional microelectronics package.
Figure 2B:
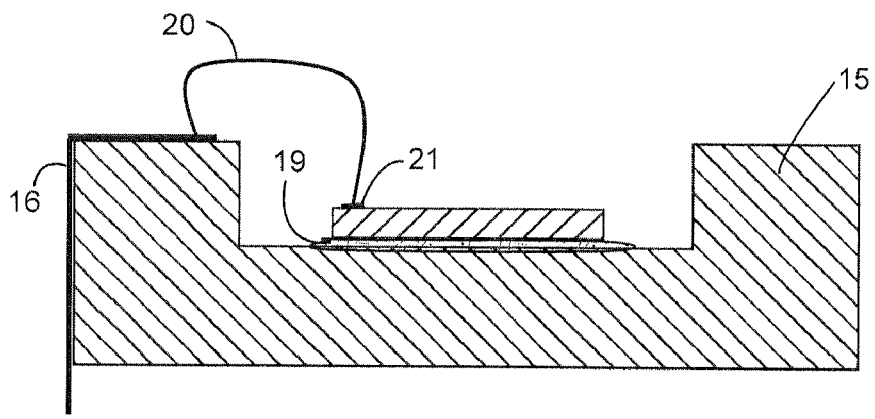
FIG. 2b is a cross-sectional view of the package of FIG. 2a taken across the mid-section at plane A-A.

FIGS. 2(a)-(b) are an illustration of a commonly used existing technique to join a semiconductor substrate to a package and is presented to illustrate the problems and disadvantages of the current approaches to packaging. Specifically, a package 14 is a conventional microelectronics package, wherein the enclosure or housing 15 is made of a plastic, ceramic, or similar material that has metal electrical leads 16 formed within or onto the package 14 to allow electrical connections to a semiconductor die 17 located with the package 14 and the environment outside the package 14. The package housing 15 has been molded to form an area called the die attach area 18 wherein the semiconductor die 17 is to be attached to the package 14 using a joining material 19. Wire bonds 20 are connected from the electrical die pads 21 on the semiconductor die 17 to the electrical leads 16 on the package 14. The die attach area 18 of the package 14 in FIG. 2 may be coated with a thin-film layer of metal having high electrical conductivity, such as gold or a similar metal having high electrical conductivity. The joining material 19 used to affix the semiconductor die 17 to the die attach area 18 in the package can be one of several types of materials, such as: solder, glass frit, epoxy, or other adhesive materials. Commonly, an electrically conductive solder can be used as an intermediate joining layer 19 between the semiconductor die 17 and the package 14 when it is desired to make an electrical connection to the semiconductor die 17, such as to apply current and/or voltage to the semiconductor devices. Alternatively, a glass frit, epoxy or other type of adhesive material can be used as an intermediate layer 19 to attach the semiconductor die 17 to the package 14, when no electrical connection is needed between the semiconductor die 17 and the package 14, since these materials act as insulators of electrical currents. Alternatively, an electrically conductive epoxy can be used as an intermediate joining layer 19 between the semiconductor die 17 and the package 14 when it is desired to make an electrical connection to the semiconductor die 17, such as to apply current and/or voltage to the semiconductor devices.

Figure 3A:
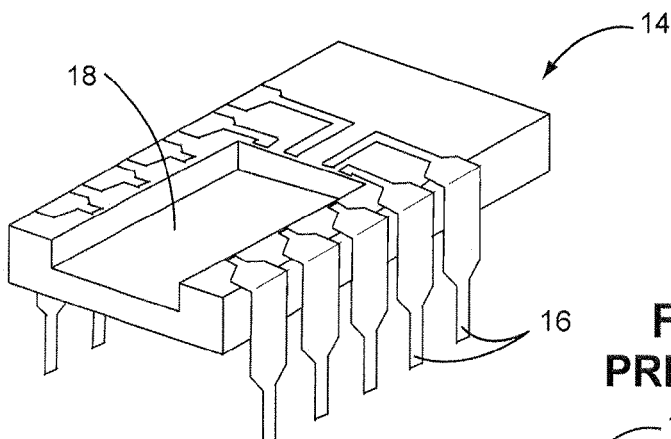
FIGS. 3a-3d are isometric views illustrating of the procedure of using a joining material to attach a semiconductor die to the die attach area in a conventional microelectronics package.
Figure 3B:
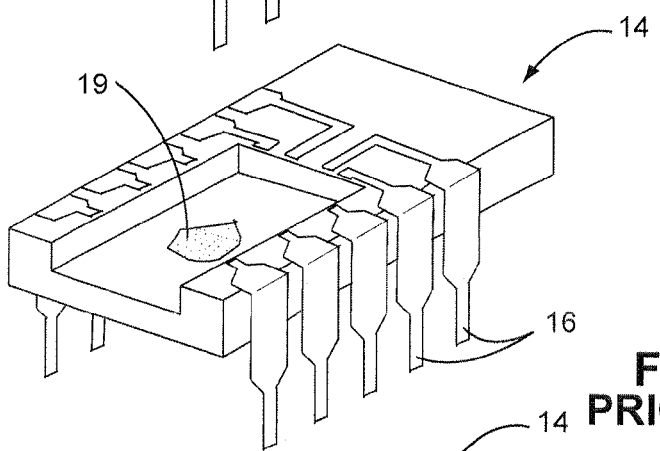
Figure 3C:
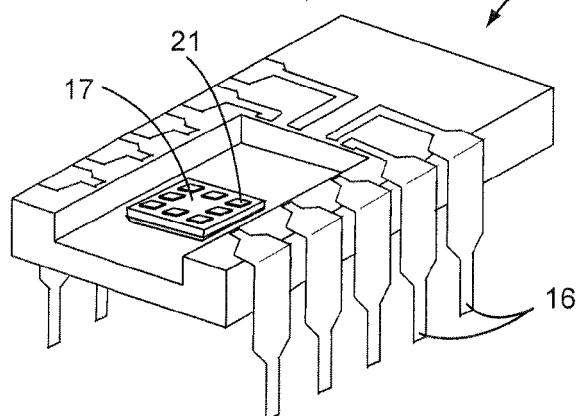
Figure 3D:
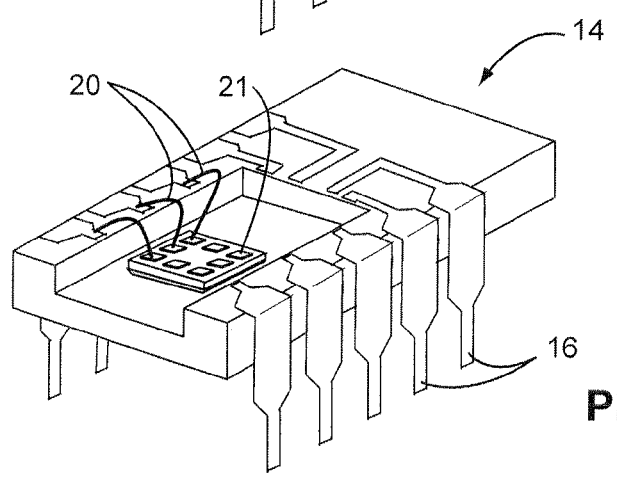

FIGS. 3(a)-(d) are an illustration of a commonly used, existing process to join a semiconductor die 17 to a conventional package 14 to illustrate the problems and challenges of the current approaches to packaging. As shown in FIG. 3(a), step 1 is the selection of a suitable package 14 for a given application. As shown in FIG. 3(b), step 2 is the placement of a small amount of joining or intermediate layer material 19 in the die attach area 18 of the package 14. This joining material 19 can be of several types, including: solder, glass frit, epoxy, or other adhesive material. Step 3, which is shown in FIG. 3(c), is the placement of the semiconductor die 17 in the die attach area 18 of the package 14 where the joining material 19 is located. This step is usually followed by an exposure to an elevated temperature and pressure to allow the joining material solder to melt, or glass frit material to re-flow, or the epoxy or other adhesive-like material to properly cure. A force normal to the semiconductor die 17 may be applied to close the gap spacing between the semiconductor die 17 and the die attach area 18 of the package 14 before or during the exposure to the elevated temperatures. The temperature used for melting, re-flowing, or curing the joining material 19 depends on the particular material used, and can vary over a large range of values, from room temperature for most epoxies to several hundred degrees Celsius for some types of solders. Subsequently, wire bonds 20 are placed using a special tool called a wire bonder (not shown) to make electrical connection from the electrical leads 16 on the package 14 to the electrical die pads 21 on the semiconductor die 17. Lastly, the package is sealed with a cover plate (not shown) to contain the semiconductor die 17 within the die attach area 18 of the package 14 by locating a cover over the open cavity in the package 14. During the stage of sealing the cavity with the cover plate, the cavity may be pumped to a reduced pressure to create a vacuum or partial vacuum in the space, or back-filled with an inert gas such as Nitrogen.

There are several major disadvantages associated with the use of an intermediate layer or layers between a metal substrate and a semiconductor substrate to join the two substrates to one another as shown in FIGS. 1, 2 and 3.

First, the use of any intermediate layer(s), such as solders, epoxies, glass frits, adhesives and the like, for joining a semiconductor and metal substrate will result in a large "built-in" residual stress that can have detrimental effects on the semiconductor device performance. For example, if a soldering material is used to mate a semiconductor to a metal substrate, the temperature of the mating process must be performed at approximately the melting temperature of the soldering material, which is typically well over one-hundred degrees Celsius. Metals usually have relatively large coefficients of thermal expansion whereas semiconductors have comparatively lower coefficients of thermal expansion. These differing thermal expansion coefficients of the materials in this system, combined with the elevated temperature required to perform the soldering process, can result in a large built-in stress between the mated substrates once the system is cooled to room or operating temperatures.

These built-in stresses result in many negative consequences related to the performance of semiconductor device(s). For example, it is well known that semiconductors will have their bandgaps and energy levels modified by the application of mechanical strains on the substrate material. Consequently, if the mating process results in built-in stresses due to the elevated temperature at which the mating process was performed combined with the differing thermal expansion coefficients of the materials used, these built-in stresses will cause the bandgaps and energy states in the semiconductor material to be altered thereby modifying the device behavior.

Additionally, moderate to large built-in stresses are known to lower the reliability of semiconductor devices. For example, semiconductor devices frequently heat-up due to the power dissipated during operation, thereby resulting in a large thermal stresses to develop between the mated materials. This thermal stress is partly or mostly due to the differing thermal expansion coefficients of the materials used in these systems, wherein metals typically have larger coefficients of thermal expansion than semiconductors. Under some circumstances, this thermal stress can become sufficiently large so as to result in the fracture of the semiconductor substrate, thereby resulting in an inoperable semiconductor device(s). Moreover, even if the thermal stress is not sufficiently large to cause fracture in one operational cycle, fracture can still result after many operational cycles (e.g., power on for some period of time with a resultant increase in temperature and thermal stress followed by a period of time with the power off with a resultant decrease in temperature and thermal stress, followed by a period of time with power on again with a resultant increase in temperature and thermal stress, etc.), due to fatigue effects in the semiconductor over several repeated cycles of operation.

Additionally, it is known that the solders used to join metals to semiconductors can re-flow from the joining interface to other areas of the device and/or package, which can result in a number of problems, such as the electrical shorting of the device. For example, as described earlier, semiconductor devices typically heat up during operation and this elevated temperature possibly combined with the stresses that the solder is exposed to (due to the different coefficients of thermal expansion of the materials used in the system) and the favorable wetting properties of the solder on the semiconductor and metal substrates, can cause the solder to partly or completely melt and re-flow to other areas of the device or package, or both. In some instances, this solder may re-flow to locations that cause an electrical shorting between parts of the device meant to be electronically isolated, thereby resulting in catastrophic failure of the device.

Alternatively, or in addition to these phenomena, the intermediate layer(s) used for joining metals to semiconductors under operational conditions can re-flow away from the areas where electrical current is flowing or a voltage potential is applied, thereby resulting in an open circuit condition as well as other serious and negative effects on the semiconductor device(s).

For example, consider the situation of a semiconductor soldered to a metal substrate wherein the metal substrate serves two functions, i.e., it provides electrical connection to the semiconductor substrate on the plane of the semiconductor onto which the metal is mated and it serves as a heat sink to the semiconductor substrate. If the solder re-flows from the interface between the metal and semiconductor substrates, the result will be the creation of voids in certain locations and an accompanying increase in the electrical resistance where the solder is no longer present. As a result, the current flowing to or from the metal to semiconductor substrates will be inhibited at the locations where solder is absent and the current will become concentrated in the locations where the solder remains. This will increase the average electrical resistance over the area over which the two substrates are mated. Moreover, in the locations where the solder has moved away from the interface where the substrates are joined, voids in the electrical continuity can occur at this interface and if the re-flow process is left to continue can eventually result in an open-circuit condition of the device. Furthermore, in the locations where the current is concentrated, the temperature of the interface will rise, thereby causing more solder to re-flow, thereby reinforcing the process to continue or even accelerate, and so on, with the eventual result that the semiconductor fails to operate.

Similarly, if the solder re-flows from the interface between the metal and semiconductor substrates, the result will be an increase in the thermal resistance at the location where the solder is no longer present. As a result, the semiconductor's temperature will rise since the heat cannot be transferred as effectively away from the semiconductor. Consequently, the interface temperature will continue to rise, thereby causing more solder to re-flow, and so on. Consequently, a positive feedback system is established whereby the semiconductor heating reinforces the solder migration, which causes additional temperature rise in the semiconductor, with the eventuality that the semiconductor will fail to operate.

Even for semiconductor devices where the result is not an immediate catastrophic failure, overheating caused by solder re-flow can have very serious consequences for the reliability of the semiconductor device(s). Most types of semiconductor devices, such as active photonic devices (e.g., laser diodes), MEMS (e.g., microsensors) and microelectronics (e.g., CMOS microelectronics), have reliabilities that degrade exponentially with increases in operational temperatures. For some devices, even relatively small temperature increases (few degrees Celsius), can result in a very large decrease in device, performance, reliability and lifetime. Therefore, any situation that results in an increase in operational temperature of the semiconductor devices will have a significant and negative effect on the semiconductor device reliability.

Additionally, the soldering processes typically use a flux material to facilitate the soldering. One purpose of the flux is to prevent oxidation of the soldering materials and is usually a mixture that is strongly reducing at elevated temperatures, thereby inhibiting the formation of metal oxides. Flux also acts as a wetting agent by reducing the surface tension of the molten solder on the substrates to be joined. However, these flux material mixtures are also corrosive and some residual flux will remain after the soldering process has been completed, and therefore, can have a negative effect on the semiconductor device(s) and/or the metal substrate.

The use of epoxies and other gluing agents also has many disadvantages for the mating of semiconductor devices to metal substrates. Most epoxies and glues are in a liquefied form to facilitate the dispensing of these agents onto the substrates to be mated. Subsequently, after spreading the epoxy or glues onto the surfaces to be joined and physically contacting them, the epoxy or glues are then "cured", whereby the solvents used to make the material liquefied are evaporated or driven off, and/or the components within the mixture react, whereby the epoxy or glue hardens or stiffens. However, during this curing or reacting process, the epoxy or glue undergoes a considerable amount of shrinkage, whereby a large amount of residual stress between the semiconductor and metal substrates results.

Additionally, epoxies and glues typically will display mechanical creep over time. Creep is the plastic deformation of a material that is subjected to a stress below its yield stress and is accelerated at higher temperatures. This creep phenomenon has many deleterious effects, such as resulting in a constantly changing stress loading on the semiconductor, thereby making stress compensation schemes difficult or impossible.

Additionally, the solvents and other components used in the epoxies and glue mixtures will continue to "outgas" even after a thorough "curing" process of these materials for many years into the future. These outgassed substances can have a deleterious effect, such as contamination or corrosion, of the semiconductor device(s).

Although a simple single example has been used in FIG. 1 to illustrate the use of an intermediate layer to bond a semiconductor substrate to a metal substrate, it is understood that the basic technology for bonding these types of substrates is similar for nearly all known applications used in the semiconductor, microelectronics, MEMS and photonic industries, and all of these different approaches suffer from the same problems as described above. Similarly, although only one type of packaging type and die bonding process is shown in FIGS. 2 and 3, it is understood that this basic technology is similar for nearly all of the known packages used in the semiconductor, microelectronics, MEMS and photonic industries and all of these different approaches suffer from the same problems as described above.

FIGS. 4(a)-(l) illustrate the first three (3) required major elements to obtain high-quality and high strength direct wafer bonding of a semiconductor substrate to a metal substrate. FIGS. 4(a)-(d) depict the first major requirement that the metal and semiconductor substrates have sufficient smoothness on their bonding surfaces. FIGS. 4(e)-4(h) depict the second major requirement relating to the metal and semiconductor substrates having sufficient flatness on the bonding surfaces. FIGS. 4(i)-4(l) depict the third major requirement that the metal and semiconductor substrates have bonding surfaces that are sufficiently clean and without particulate matter on them.

Figure 4A:
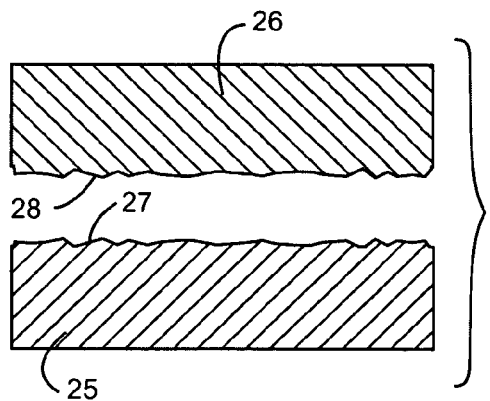
Figure 4B:
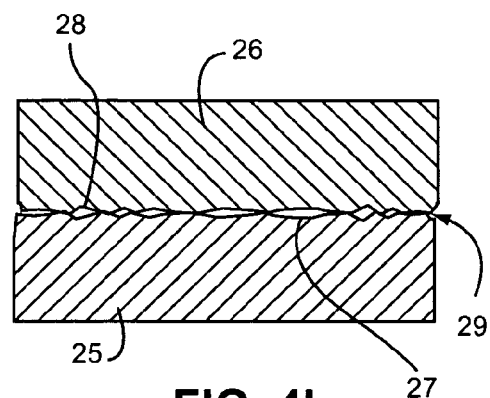
Figure 4C:
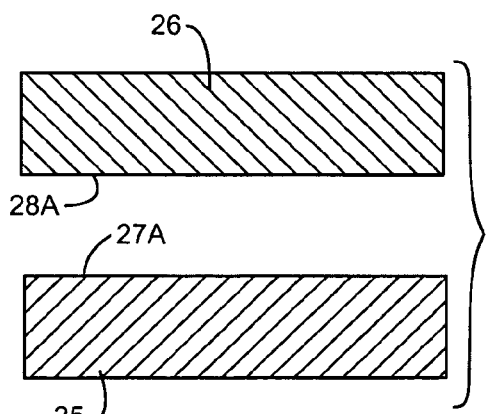
Figure 4D:
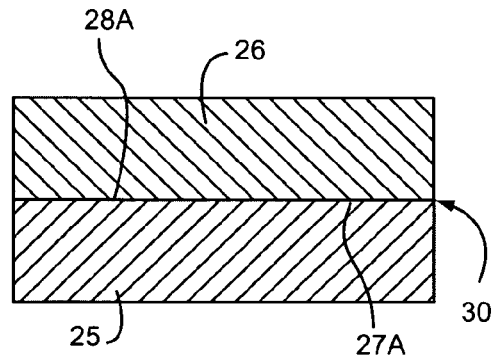
Figure 4I:
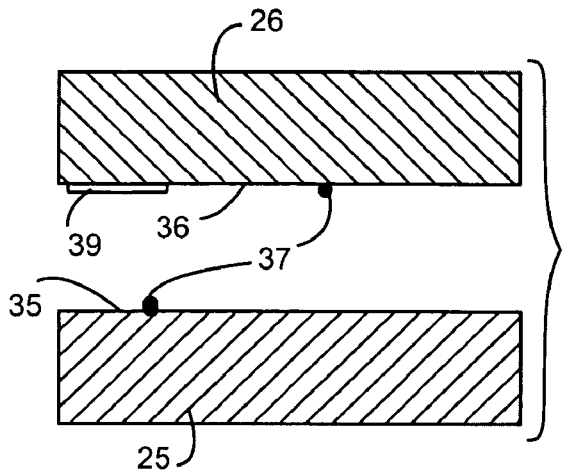

As shown in FIGS. 4(a)-4(d), the metal substrate 25 and the semiconductor substrate 26 to be bonded must have atomically smooth surfaces to obtain good bonding results. When the surfaces 27 and 28 of substrates 25 and 26, respectively, are not sufficiently smooth, as shown in FIG. 4(a), the result is a poor bonding of substrates 25 and 26 due to an interface that is not completely in contact over the substrate surfaces 29, as shown in FIG. 4(b). But, when the surfaces 27 and 28 are mirror polished so as to be sufficiently smooth to be direct bonded, as are surfaces 27A and 28A shown in FIG. 4(c), the result is excellent bonding of substrates 25 and 26, due to a smooth interface 30 that allows contact of the substrates over the entirety of surfaces 27A and 28A, as shown in FIG. 4(d). This level of smoothness on the surfaces 27A and 28A usually requires a chemical-mechanical polishing (CMP) process to be performed on the surfaces 27 and 28 prior to bonding, whereby a slurry composed of abrasives immersed in a chemical etchant solution specific to the substrate material is applied to the substrate surfaces 27 and 28 as they are forced under pressure loading against rotating polishing pads (not shown) so as to obtain a smooth surface 28A on the semiconductor substrate 26 and a smooth surface 27A on the metal substrate 25. The resultant surface smoothness obtainable varies, depending on the substrate materials, as well as the exact CMP methods used. But, smoothness levels of one to several Angstroms are possible with this method using state-of-the-art CMP equipment from the semiconductor industry. Importantly, the required smoothness for high-quality and high-strength bonding depends on the substrate material types, as well as the ability to meet the other bonding requirements (as discussed below); but generally, a surface smoothness of several Angstroms is sufficient for most applications. However, higher levels of roughness of up to a several nanometers can be tolerated in some occasions. High levels of surface smoothness are required because the initial bonding (i.e., pre-bonding) of the substrates is based on intermolecular van de Waals forces of attraction between the surfaces 27A and 28A of the two substrates 25 and 26. Due to the fact that these intermolecular forces are short-range forces, smoothness of the to-be-contacted surfaces is extremely important since this determines the distance over which the intermolecular forces can be effective. Excessive roughness on the surfaces 27 and 28 prevents the surfaces from getting sufficiently close together, as shown in FIG. 4(b), to allow the intermolecular forces to have sufficient attractive force between the substrates surfaces 27 and 28. For mating surfaces terminated with non-polar molecular groups, the force of attraction can be mainly due to the dispersive forces that result from the fluctuating charge distributions from a non-zero average dipole moment. This dispersive force between the surfaces reduces very rapidly with separation between the surfaces. Consequently, for the dispersive forces to be most effective, the surface smoothness must be on the same order as the lattice constants of the materials in the substrates, which is around 2 to 5 Angstroms for most materials, corresponding to a Root-Mean Square (RMS) surface roughness of about 0.5 to 1 Angstroms RMS. In general, the amount of smoothness required for good bonding relates to the types of materials to be bonded, as well as to the thickness of the substrates. That is, some types of materials need to be smoother than other types to achieve good bonding due to the ability of the material to conform during the bonding process. However, even for very thin substrates, the substrates must be very smooth for good bonding. Once the surfaces 27A and 28A of the two substrates 25 and 26 are sufficiently smooth, the substrate surfaces 27A and 28A can be brought into contact and a good interface bond 30 between surfaces 27A and 28A will be obtained as shown in FIG. 4(d).

FIGS. 4(e)-4(h) illustrate the second requirement for good direct substrate bonding that the two substrates 25 and 26 to be bonded are extremely flat. The definition of flatness is not the same as smooth as illustrated in FIGS. 4(a)-(d). In general, "smoothness" relates to the lack of roughness or topology on the surface of the substrate as examined over a relatively small area, whereas "flatness" is the large-scale variations in the surface of the substrate as examined over a relatively larger area. A surface can be very flat, yet also very rough; or a surface can have a large variation in the flatness, yet also be very smooth. For good bonding, it is desired that the surfaces are both very flat and very smooth. Flat and rough substrate surfaces 27 and 28 (as in FIG. 4(a)) will not bond as well as flat and smooth substrate surfaces 27A and 28A (as in FIG. 4(c)), since the contacting areas 29 of the two substrates 25 and 26 are limited in the case of the flat and rough substrate surfaces 27 and 28. The reason for substrate smoothness is very simple, i.e., the substrate surfaces cannot come into intimate contact if the surfaces are not smooth. Similarly, smooth and non-flat substrate surfaces 31 and 32 (as in FIG. 4(e)) will not bond as well as a smooth and flat substrate surfaces 31A and 32A (as in FIG. 4(g)) since the contacting areas 33 of the two substrates 25 and 26 are limited in the case of the smooth and non-flat substrate surfaces 31 and 32. The reason for substrate flatness is very simple, i.e., the substrate surfaces cannot come into intimate contact across the entire substrate surface if the surfaces are not flat.

The flatness of substrates can be defined by a parameter called the "Total Thickness Variation" or "TTV", which is illustrated in FIG. 4(e). TTV is defined as the difference between the high and low points on the substrate surface. The exact requirement for substrate surface flatness varies, depending on the type of substrate materials that are to be bonded, as well as how well the other bonding criteria have been met. For example, if one of the substrates had the thickness thinned down considerably, the substrate will be less mechanically stiff and will be better able to conform to another substrate surface that is not perfectly flat. Conversely, if the substrates are normal thicknesses (several hundreds of microns or more in thickness), then both substrates should be very flat, typically no more than a few microns over a normal wafer substrate area (e.g., 100 mm wafer diameter) or less. Therefore, there is a relationship between the thickness of the substrates and the requirement of flatness of the substrates for good bonding. In general, using conventional semiconductor lapping and CMP polishing techniques, the ability to obtain sufficient flatness of the substrates for good substrate bonding is possible. In general, for good substrate bonding, the substrates surfaces 31 and 32 should have a TTV of 1 to 2 microns or better over the area of a 100 mm diameter substrate. Importantly, a TTV of a larger amount may be acceptable to achieve good bonding for a smaller area substrate, and vice versa.

Figure 4J:
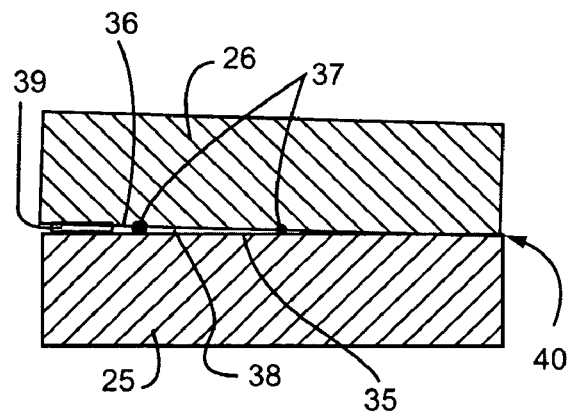
Figure 4K:
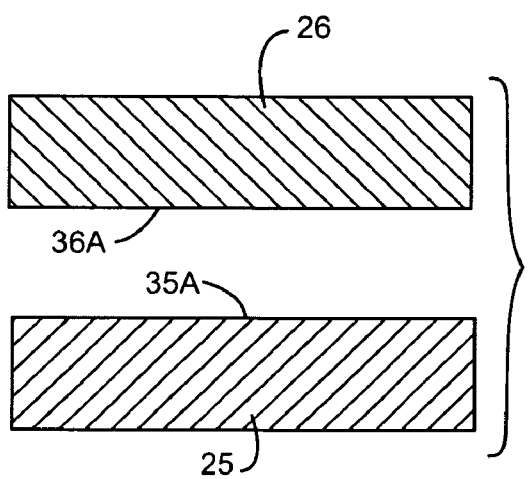
Figure 4L:
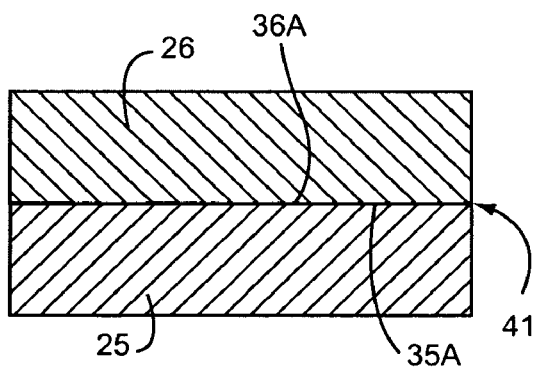

FIGS. 4(i)-4(l) illustrate the third requirement for good direct substrate bonding of cleanness and a particulate-free nature of the substrate surfaces 35 and 36 prior to physical contact of the substrates 25 and 26. High quality, high strength substrate bonding requires that the surfaces of the substrates be absolutely free of any particulates 37 (even very small, i.e., sub-micron diameter, ones), free of any surface contaminants (not shown since dimensional scale is too small), and free of any surface residues 39. Furthermore, the physical contacting (i.e., pre-bonding) of the substrate surfaces 35 and 36 must be performed in a very clean environment, preferably a class-10 or class-1 clean room or better. Any particulates 37 on the substrate surfaces 35 and 36 generally result in an area 38 of the substrate that is prevented from making intimate contact between the surfaces, thereby degrading the ability to bond the substrate surfaces 35 and 36. FIG. 4(j) illustrates the effect of small particulates 37 on the surfaces of the substrates 25 and 26 and its degrading effect on the substrate bonding. As can be seen in FIG. 4(j), the substrate surfaces surrounding the particulate are prevented from contacting. FIG. 4(j) also illustrates the effect of a residue 39 on the surface of a substrate wafer 26 and its effect to reduce the ability of a bond between the two substrates 25 and 26. Similar to the relationship on substrate surface flatness, there is a relationship to the particulate size, the substrate thickness, and its effect on the bonding. The presence of a very small particulate 37 on one of the substrate surfaces may result in the void 38 between the substrates. The void 38 is the result of the substrates 25 and 26 partially mechanically conforming around the particulate 37 to make a substrate bond that surrounds the particulate. Obviously this can only occur if the substrates 25 and 26 are sufficiently mechanically compliant. However, if the particulate 37 is large and/or the substrates 25 and 26 are thick and/or made of very stiff materials, then the substrate surface attractive forces may be insufficient for the surface to come into contact and stay in contact, and substrate bonding (even without the presence of voids) may not be possible.

Once the requirements to achieve good bonding on the substrate surfaces as described in FIGS. 4(a)-4(l) have been satisfied, the bonding of the metal substrate 25 to the semiconductor substrate 26 can be performed. Moreover, the bonding of a semiconductor substrate 26 to a metal substrate 25 can be further enhanced so as to achieve higher bonding quality, higher bonding strength, and/or lower bonding temperatures, as well as low electrical resistance and low thermal resistance across the bonded interface between the two substrates 25 and 26 according to one of the exemplary methods described herein.

Figure 5A:
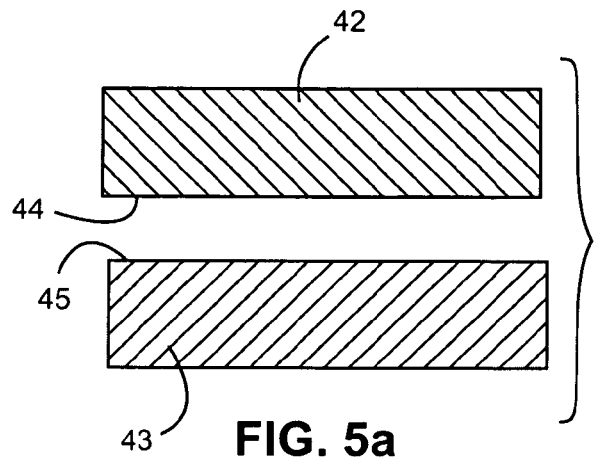
FIGS. 5(a)-(d) are cross-sectional views illustrating a generalized process flow or sequence illustrating a process for the bonding of a metal substrate to a semiconductor substrate.

FIGS. 5(a)-(d) illustrate generally the innovative surface preparation techniques of the bonding method of the present invention, which allow direct substrate bonding to enable heterogeneous substrate materials, such as semiconductor and metal substrates, to be bonded together with high resultant bond strength. As shown in FIG. 5(a), the surface 44 of semiconductor substrate 42 and the metal substrate 43 are cleaned and prepared. These surface preparation techniques involve planarization or lapping and polishing of the surfaces 44 and 45 to be bonded, such that the surfaces are "atomically smooth" and are extremely flat over their entirety. This can be achieved in a number of ways, but the preferred method is to use chemical-mechanical polishing (CMP) to achieve an adequately smooth and flat surface finish on the substrate surfaces 44 and 45.

Although the level of surface flatness required to achieve good bonding will vary depending on many factors, including the substrate materials used, the type of surface chemical treatments used prior to pre-bonding, the level of smoothness of the substrate surfaces, the mechanical pressure used during pre-bonding, the annealing temperature employed for the bonded substrates, etc., a flatness of less than a few microns over a substrate with a diameter of edge length of a few to several inches is usually sufficient.

Likewise, the level of surface smoothness required to achieve good bonding will also vary, depending on many factors, including the substrate materials used, the flatness of the substrates, the type of surface chemical treatments used prior to pre-bonding, mechanical pressure used during pre-bonding, the annealing temperature employed for the bonded substrates, etc. A surface smoothness of a few Angstroms or more is typically sufficient, but higher levels of roughness can be tolerated in some circumstances.

Therefore, in the preferred embodiment, the semiconductor substrate 42 is polished so as to obtain a surface 44 with a surface smoothness with sufficient and flatness for bonding, typically a smoothness of around several Angstroms to a several nanometers and a flatness of several microns over a few centimeter-sized substrate, prior to the pre-bonding. Additionally, the metal substrate 43 is also polished to achieve a surface 45 with the same level of surface smoothness and flatness as obtained for the semiconductor substrate surface 44. Both the semiconductor and metal substrates 42 and 43 are polished and flattened using chemical-mechanical polishing (CMP) techniques that are commonly used in the semiconductor industry. The exact type of slurry used for the CMP process will depend on the type of semiconductor and metal substrates, but there are commercially available slurries for most every type of semiconductor substrate material and many types of metals. In any case, in the preferred embodiment of the present invention, it is desired that the substrate surfaces 44 and 45 be as smooth and flat as possible, since this will enable the bond strength and bond quality to be as high as possible.

After polishing, the substrates 42 and 43 need to have all particulate matter, debris, and chemicals removed from the surfaces 44 and 45. A variety of methods can be employed for this purpose, including slightly acidic and/or basic aqueous solutions or solvents any of which may be combined with physical agitation. For hard to remove particulate matter or debris, a soft brushing of the surface can be used, but care must be taken to ensure that the surface is not damaged, etched or roughened.

Figure 5B:
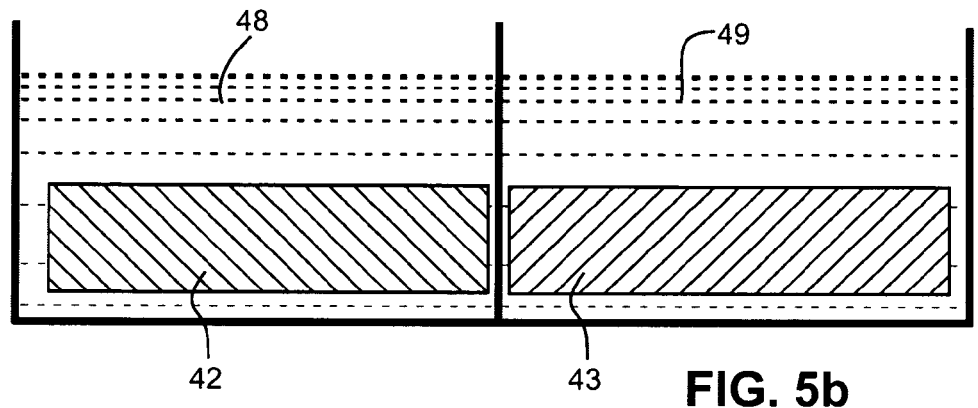
Figure 5C:
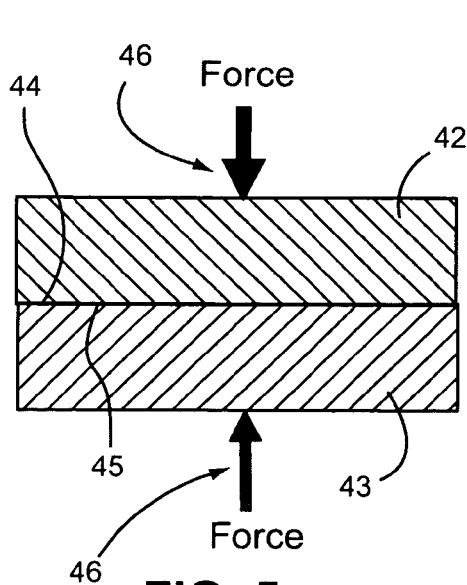
Figure 5D:
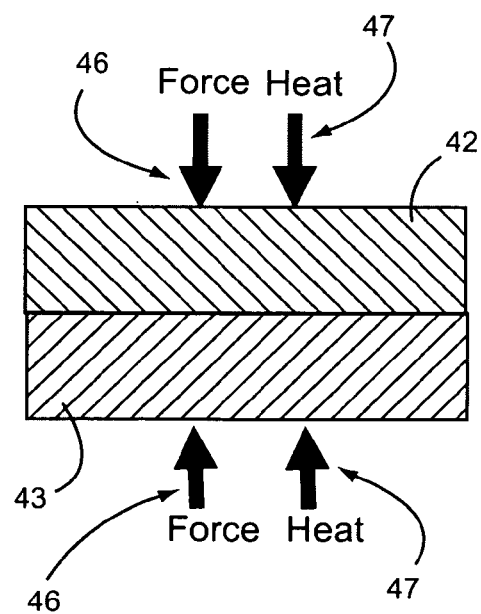
Figure 6A:
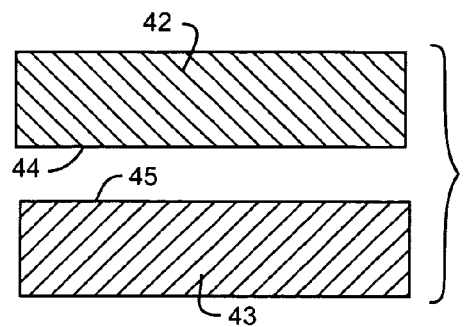
FIGS. 6(a)-6(e) are cross-sectional views depicting plasma activation of the substrate surfaces prior to physical contacting in low-temperature bonding.
Figure 6B:
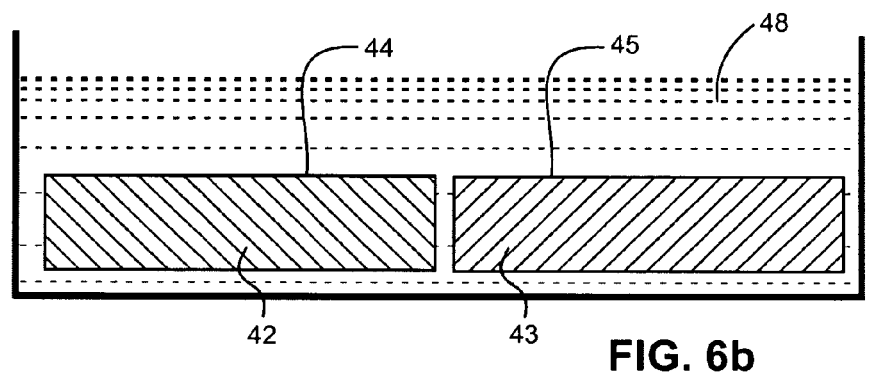
Figure 6C:
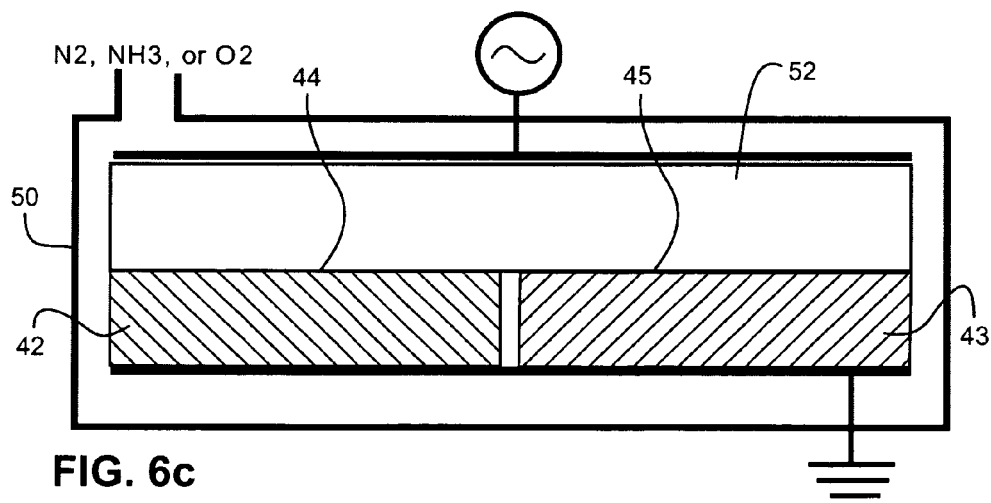
Figure 6D:
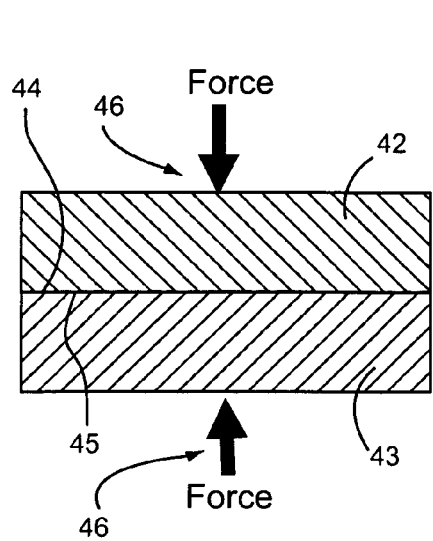
Figure 6E:
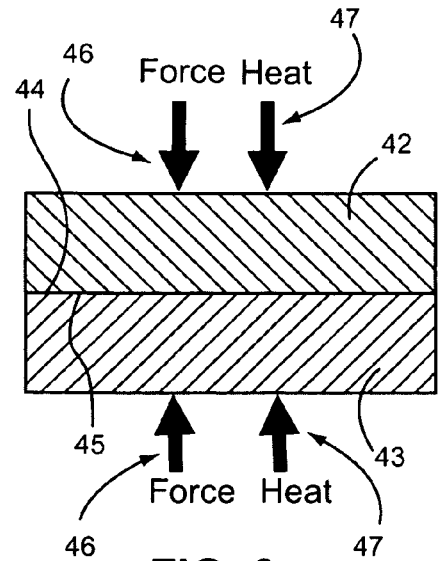

The semiconductor and metal substrates 42 and 43 will be prepared for bonding by first performing a thorough cleaning of the substrates using a chemical immersion, as shown in FIG. 5(b). The type of chemical cleaning solution 48 used will depend on the type of semiconductor and metal materials employed for the semiconductor substrate 42 and metal substrate 43. While the same cleaning solution 48 may be used for both the semiconductor substrate 42 and metal substrate 43, it may be necessary to use a different cleaning solutions 48 and 49 for each of the two substrates 42 and 43, especially if there are material/chemical incompatibilities. In any case, removal of the particulate matter is done using a chemically-compatible cleaning solution that may be an immersion in an aqueous solution 48 that is either slightly acidic or slightly basic or may be solvent-based and may also require the use of a mechanical scrubbing action or an ultrasonic agitation during the chemical immersion. Importantly, this mechanical scrubbing or ultrasonic agitation should be sufficiently aggressive to remove the contamination and particulate on the surface, but without being so aggressive as to degrade the surface finish, particularly the surface smoothness of the substrates.

One frequently used chemical cleaning agent used to remove organic residues on silicon semiconductor substrates is called the RCA-1 clean and usually is composed of a mixture of 5 parts of De-Ionized (DI) water to one part each of Ammonium hydroxide and Hydrogen peroxide. This mixture is heated to between 70 and 80 degrees Celsius and the substrates are immersed into this solution for approximately 15 minutes. Subsequently, the substrates 42 and 43 are thoroughly rinsed in DI water and spin-rinsed and dried, followed with a physical contacting (FIG. 5(*c*)) with the application of a normal force 46 to press the substrates together. An elevated temperature anneal (FIG. 5(*d*)) using the application of heat 47 is typically used to complete the bonding process of the substrates 42 and 43.

An alternative substrate cleaning procedure is to immerse one or both of the substrates 42 and 43 in an acidic mixture of sulfuric acid and hydrogen peroxide, so-called "piranha etch", and although a variety of solution mixtures can be used, one such commonly used mixture is composed of 3 parts of sulfuric acid to 1 part of hydrogen peroxide. This mixture forms an exothermic reaction that self-heats up to between 80 and 120 degrees Celsius. The semiconductor wafer 42 and perhaps the metallic wafer 43, depending on the material compatibility, can be immersed into the mixture 48 for approximately 1 to 15 minutes, after which the wafer(s) are rinsed in DI water and then spin-rinsed and dried. This is followed by physically contacting the wafers 42 and 43 (FIG. 5(*c*)), and the application of a normal force 46 to press the substrates together, and completed with an elevated temperature anneal by the application of heat 47 (FIG. 5(*d*)) to complete the bonding process of the substrates 42 and 43. Optionally, force 46 may be applied during the annealing step to facilitate the bonding.

In any case, it is realized that the type of chemical cleaning performed must be chosen so as to be compatible with the material type of the substrates. There are a number of chemical surface treatments that can be used to clean the surface as well as increase the bond strength and bond quality. These treatments include chemical immersions as well as plasma exposures (as described below). The cleaning processes are directed at removing all particulate matter, debris, organic and non-organic contaminants from the surfaces of the substrates. Importantly, the cleaning method should not damage, etch, or roughen the surfaces since this will degrade bond quality and strength.

In addition to cleaning the surfaces, a chemical immersion process to "activate" the surfaces is also frequently used. Activation of the surface means to intentionally treat the surfaces in order to terminate the molecular bonds at the substrate surface with dipole molecules that result in increased bonding strength due to the strong dipole-to-dipole attractions across the bond interface. If Hydrogen-terminated molecules are used then this is commonly called "hydrogen bonding". However, this term is often used to describe dipole molecules of other types as well.

For example, the chemical immersion in piranha etch solution performed prior to physical contacting of the wafers is believed to result in dangling —OH chemical bonds on the surface of the substrates which results in increased electrical charge which facilitates the bonding. This effect can be achieved by many chemical immersions involving aqueous solutions and can result in longer-range intermolecular forces (compared to Hydrogen bonding) across the interface thereby increasing bond strength or alternatively lessening the requirement on surface smoothness to achieve room temperature bonding. For example, on surfaces which have been treated such that the substrate surfaces are terminated with OH, NH, or FH, the RMS roughness can be several times higher than that required without the treatment to achieve good bonding.

The next step in bonding is to physically contact the substrate surfaces 44 and 45. As shown in FIG. 5(*c*), the substrates surfaces 44 and 45 are physically contacted (i.e., pre-bonded) at room temperature. This is performed by bringing the two substrates 42 and 43 together, which can be facilitated by applying a normal force 46 to the substrates. This contacting step, sometimes called "pre-bonding" can be done using special equipment to enable alignment of the substrates. That is, the two substrates 42 and 43 can have markings on them to allow them to be aligned and then bonded.

It is very important that the physical contacting of the substrates 42 and 43 occurs very soon after the substrates have been cleaned and activated. The reason is that the substrate surfaces become electrically charged during the cleaning and activation processes and will therefore attract airborne particulates and aerosols to the surfaces, which will degrade the quality and strength of the bond. Moreover, it is also important that the physical contacting of the substrates is performed in a very clean environment, preferably a class 1 to class 10 clean room environment or better.

Lastly, after physical contacting of the substrate surfaces 44 and 45, as shown in FIG. 5(*c*), wherein a mechanical force 46 can be applied to facilitate that the two substrate surfaces 44 and 45 come together, the pre-bonded substrate pair will typically be annealed for a time at an elevated temperature by the application of heat 47 to result in bonding of the two substrates 42 and 43, as shown in FIG. 5(*d*). This annealing step varies, depending on the type of substrates being bonded and the exact surface preparation and activation recipe being employed, but may be performed from slightly above room temperature to over 1000 degrees Celsius for a few minutes to hours depending on the degree that the surfaces 44 and 45 have been thoroughly smoothed, flattened and cleaned as well as the degree that the substrate surfaces 44 and 45 have been activated to ensure a high-strength substrate pre-bond has been obtained. The ambient gases used during the pre-bonding can vary over a range of different types or may be a combination of gases at varying partial pressures, or even a vacuum or partial vacuum. The ambient gases used during the anneal can also vary over a range of different types or may be a combination of gases at varying partial pressures.

Alternatively, the normal force 46 may be applied simultaneously while the elevated temperature anneal is being performed by the application of heat 47 to the substrates 42 and 43 during bonding.

A variation of the above-described bonding process is shown in FIGS. 6(*a*)-(*e*), and is directed to enable the low-temperature bonding of substrates and involves the exposure of the substrates after cleaning and before pre-bonding to a plasma, such as an oxygen plasma. This is called "plasma activation" of the surfaces. As shown in FIG. 6(*b*), the substrates 42 and 43 are cleaned and prepared using any of the cleaning and preparation techniques described herein which are suitable for the type of semiconductor substrate 42 and metal substrate 43 to be bonded. Subsequently, as shown in FIG. 6(*c*), the substrate surfaces 44 and 45 are plasma activated by placing them in a plasma chamber 50 to activate the surfaces 44 and 45 by exposing them to a plasma 52. Plasma activation prior to physical contacting creates a high level of charging of the surfaces of the substrates that not only increases the strength of substrate bond, but also allows high-strength substrate bonding to be achieved even with a relatively low temperature anneal. Specifically, in one embodiment, an oxygen plasma treatment of substrates prior to physical contacting allows the substrates to be annealed at temperatures of 300 degrees Celsius or lower. Alternative to the use of an oxygen plasma treatment, other plasma activation treatments can be used including Nitrogen, Ammonia, and others. As shown in FIG. 6(d), after the substrate surfaces 44 and 45 are physically contacted, a normal force 46 can be applied to facilitate the substrates 42 and 43 come together. Then as shown in FIG. 6(e) the substrates 42 and 43 are annealed together at an elevated temperature by applying heat 47 to bond the substrates together. The bonded pair of substrates is then cooled. Optionally, a force 46 can be applied during the anneal to facilitate the bonding.

Alternatively, the semiconductor substrate 42 and the metal substrate 43 may be both cleaned using a suitable cleaning solution and then only the surface 44 of the semiconductor substrate 42 is plasma activated using the above described method. Subsequently, the substrates 42 and 43 are then brought together and bonded using the applied of a normal force 46 and applied heat 47.

Figure 7A:
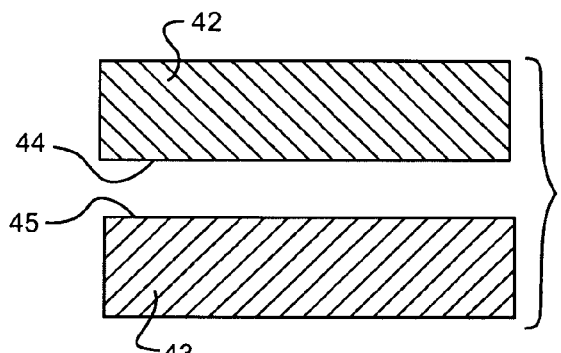
FIGS. 7(a)-7(c) are cross-sectional views of field-assisted bonding of a semiconductor substrate to a metal substrate.
Figure 7B:
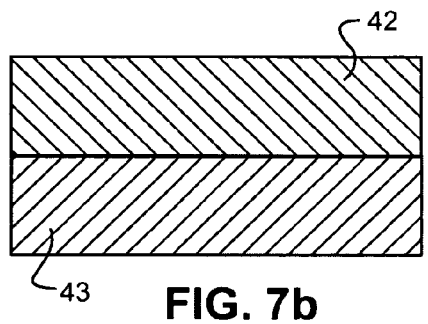
Figure 7C:
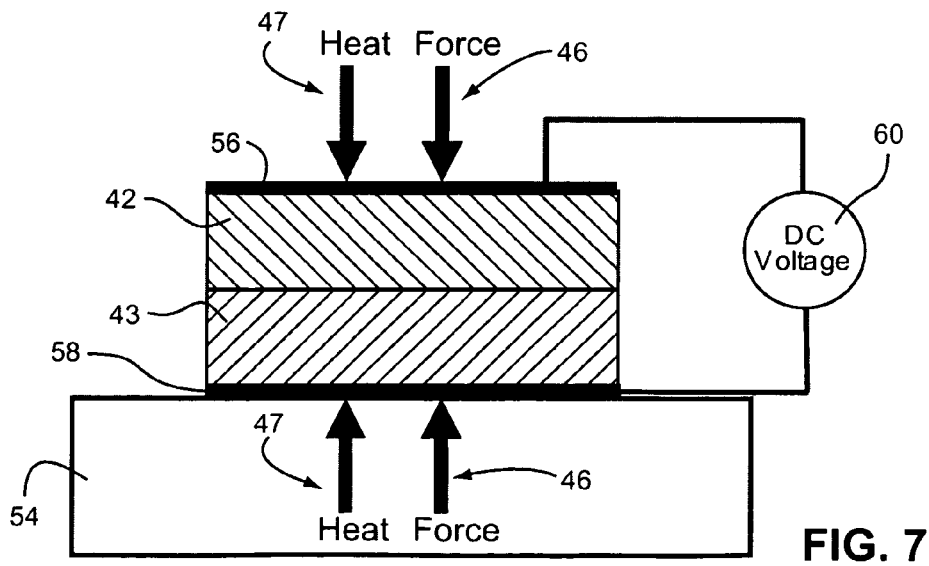

Another variation on the process to bond two substrates 42 and 43 together is illustrated in FIGS. 7(a)-(c). This process variation is called field assisted bonding, and typically involves the same substrate preparation steps (FIG. 7(a)) prior to physical contacting (FIG. 7(b)) including smoothing, flattening, cleaning, and surface activating as described above. But after physical contact is made between the substrates, an electrical potential field is applied across the substrates simultaneously to the application of heat 47 and possibly a normal force 46. As shown in FIG. 7(a), the semiconductor substrate 42 and the metal substrate 43 are first prepared and cleaned using any of the cleaning and preparation techniques described herein which are suitable for the type of semiconductor and metal substrates to be bonded. A surface activation may also be performed on the semiconductor substrate 42 only or both substrates 42 and 43. Subsequently, as shown in FIG. 7(b), the substrates 42 and 43 are physically contacted to pre-bond them together. Lastly, as shown in FIG. 7(c), the substrates 42 and 43 are placed on a hot plate or heating element 54 and electrodes 56 and 58 attached to a voltage source 60 are applied to substrates 42 and 43 to create a voltage potential across the pre-bonded substrates. A normal force 46 may also be applied to press the two substrates 42 and 43 together during the bonding process. Free charge carriers of opposing signs in the materials migrate to the interface in each of the materials thereby establishing a very high electrical field across the interface. This high electrical field combined with the elevated temperatures enables the two substrates 42 and 43 to bond with a very high strength. An alternative of this technique is to only apply the electrical field without heating 47 or without force 46 to bond a semiconductor substrate 42 to a metal substrate 43 as well.

If low resistance electrical conduction through the bonded interface between the semiconductor substrate 42 and the metal substrate 43 is required, then it is important that any native oxides are removed from each of the substrates prior to bonding. Native oxides readily form on the surfaces of many material types and usually result in an oxide that is at least a few Angstroms to a few nanometers in thickness. If left in place, this native oxide would act as an electrical insulator between the metal and semiconductor and thereby prevent charge conduction across the interface—i.e., result in a non-ohmic contact across the interface. Therefore, the removal of any native oxide from the surface of the substrates is extremely important to ensure that the interface between the bonded semiconductor substrate and the metal is electrically conducting.

The exact method for removal of the native oxide will vary, depending on the substrate materials to be bonded. For example, in the case where the semiconductor substrate is silicon, a dilute Hydrofluoric acid (HF) in water with a concentration ranging between 10:1 and 50:1 for less than one minute will be sufficient to remove the native oxide. This immersion in chemical native oxide removal solution can be performed under agitation or irrigation.

To bond the semiconductor substrate 42 to a metal substrate 43, the metal substrate 43 must also be properly cleaned and prepared prior to bonding, which may include activation of the surfaces and the removal of any oxides on the surface of the substrates 42 and 43 in order to obtain low electrical resistance across the bonded interface as well as a low temperature bond. In some cases, the cleaning, activation, and preparation solutions can be performed with a single solution, as well as a single solution for both substrate 42 and 43 types, while in other cases the solution may be of different types for each of the steps of cleaning, activating and removal of native oxides as well as for each of the substrates 42 and 43 types. The exact type of cleaning, activation, and preparation solutions used will depend on the type of metal or metal alloy to be bonded to the semiconductor and may be a different solution from that used to clean the semiconductor substrate 42. For example, if the metal substrate is made of copper (Cu) or a mixture of copper and some other metal, one technique for cleaning of the metal substrate would first involve removal of any organic contamination on the surface using an organic removal processes, some of which are described above, followed by the removal of native oxides using an immersion of Acetic Acid (CH3COOH) at a concentration of up to a 4 vol % water dilution at 35 degrees Celsius for a few minutes. Again, each type of metal will have its own optimal chemical solution for cleaning and native oxide removal.

Next, the two substrates are dried using an appropriate method and then physically contacted to pre-bond them together. The method of drying depends on the exact type of semiconductor and metal substrates to be bonded, but can involve the blowing of an inert gas across the substrate surface to force any liquid to be removed or placing the substrate in a vacuum to evaporate any remaining liquids from the surfaces.

The substrates 42 and 43 are then physically contacted by placing the polished surfaces 44 and 45 of the two substrates 42 and 43 together and preferably pressed together using a normal force 46 to facilitate the bonding process. The substrates can be aligned prior to the physical contacting to register the features or devices on one substrate to the features or devices on the other substrate.

The substrates can be bonded in an ambient gas to enclose the gas inside any cavities that will be made between the two bonded substrates. The exact type of gas can be selected as desired, but may be an inert gas such as Argon or Nitrogen, if one is concerned about maintaining an inert gas environment inside the sealed cavity for a given application.

The substrates can be bonded in a vacuum environment to create a sealed vacuum environment inside any cavities that will be made between the two bonded substrates. The exact level of vacuum can be selected as desired for a given application.

Alternatively, the substrate surfaces may be pre-bonded in an inert gas environment in order to prevent the surfaces from being exposed to an oxidizing or reducing environment, to thereby eliminate or reduce the formation of native oxides or other compounds on the substrate surfaces.

Lastly, the pre-bonded substrates are annealed at an elevated temperature by the application of heat 47 to strengthen the bond between the substrates. This annealing can be performed in a non-oxidizing ambient (i.e., Nitrogen, Argon, or similar gas) ranging from slightly above room temperature to over 100 degrees Celsius or more and for a time of 15 minutes or longer.

The annealing temperature obtained by the application of heat 47 and time have a strong effect on the resultant bond strength of the bonded substrate pair 42 and 43. Specifically, there is a tradeoff between the annealing temperature and the annealing time; that is, if the annealing temperature is higher, then the annealing time can be reduced and vice versa for the same strength bond. In general, bonding strength is increased with higher annealing temperatures for longer times.

Alternatively, a plasma treatment to activate the surfaces 44 and 45 of the substrates 42 and 43 prior to physical contacting may be performed to enhance the bonding process and increase the resultant bond quality and strength as shown in FIGS. 6(*a*)-(*e*). For plasma treatment, the substrates 42 and 43 are cleaned using any of the methods previously described as shown in FIG. 6(*b*) and then inserted into a vacuum chamber 50 as shown in FIG. 6(*c*) wherein the pressure inside the chamber is reduced to a low pressure. A plasma 52 is then struck using either Nitrogen (N2), Ammonia (NH3), or Oxygen (O2) at a pressure between 50 mTorr and 250 mTorr. The time of the plasma 52 exposure to the surfaces 44 and 45 varies on the substrates 42 and 43 material types, the type of gas used in the plasma 52, as well as the plasma 52 power used, but typically will vary from less than 1 minute to less than 10 minutes. An exposure for too long in the plasma 52 can damage the surfaces 44 and 45 of the substrates 42 and 43 thereby reducing the ability of the substrates 42 and 43 to bond effectively and therefore care must be shown to ensure that the plasma 52 treatment is for a sufficient time to activate the surfaces 44 and 45, but not too long a period of time to damage the surfaces 44 and 45.

After the plasma 52 activation, the substrates 42 and 43 are removed from the process chamber 50 and physically contacted as shown in FIG. 6(*d*). Subsequently, the substrates 42 and 43 are annealed by applying heat 47 to them to strengthen the bond as shown in FIG. 6(*e*). The plasma 52 activation is thought to increase the presence of free radicals and thereby the reactivity of the surfaces 44 and 45 so as to make the substrates 42 and 43 bond better. A normal force 46 may be applied to press the substrates together either before the anneal or during the anneal when heat is applied 47.

Most importantly, it is known that the plasma 52 activation allows the annealing temperature to be significantly reduced, while obtaining a sufficiently high bond strength. Usually this annealing will be conducted at a temperature ranging from slightly above room temperature over 100 degrees Celsius depending on the bond strength required and the substrate 42 and 43 materials being bonded.

An alternative to the plasma 52 activation process is to immerse the substrates 42 and 43 in a water (i.e., DI water) or aqueous solution immediately after the plasma 52 activation, but before physically contacting the substrates 42 and 43. This water or aqueous immersion allows free radicals to attach to the surfaces 44 and 45, thereby enhancing the bonding. As with previous process variations described above, if the immersion is performed after the plasma 52 activation, the substrates 42 and 43 will be immediately physically contacted and then annealed at a temperature ranging from slightly room temperature to 100 degrees Celsius or higher, depending on the bond strength required and the substrate 42 and 43 materials being bonded.

Plasma 52 activation can alternatively be performed using a Hydrogen plasma 52, specifically in the ratio of approximately 1:1 with Argon. The Hydrogen plasma 52 is thought to remove any residual hydrocarbons on the surfaces 44 and 45 (which degrade bond quality and strength) as well as any native oxides on the surfaces 44 and 45 of the substrates 42 and 43. This plasma 52 activation is performed for a several seconds to 15 minutes at a temperature of 150 to 250 degrees Celsius and a pressure of 2 to 8 mTorr. Subsequently, without breaking vacuum, the substrates 42 and 43 are taken to an Ultra-High Vacuum (UHV) [$10^{-7}$ to $10^{-10}$ Pascals] pressure and 600 degrees Celsius for a few minutes (2 to 6 minute) to remove the hydrogen on the surfaces 44 and 45 leaving very clean, reactive and hydrophilic surfaces 44 and 45. After this plasma 52 activation, the substrates 42 and 43 are immediately physically contacted wherein a normal force 46 may be applied to press the substrates 42 and 43 together and then the substrates 42 and 43 are annealed at a temperature ranging from slightly above room temperature to over 100 degrees Celsius by applying heat 47, depending on the bond strength required and the substrate 42 and 43 materials being bonded.

Plasma 52 activation and native oxide removal can also be performed by placing the substrates 42 and 43 in a UHV chamber 50 and heating them to 850 degrees Celsius for 20 to 40 minutes at a pressure of $10^{-9}$ to $10^{-10}$ Pascals as shown in FIG. 6(*c*). The heating is not shown in the plasma chamber in FIG. 6(*c*). After plasma 52 activation, the substrates 42 and 43 are immediately physically contacted and then annealed at a temperature ranging from slightly above room temperature to over 100 Celsius, depending on the bond strength required and the substrate 42 and 43 materials being bonded.

Obviously, the exact process recipe used will depend on the type of materials that the substrates 42 and 43 are made from to be bonded, whether any devices or materials on the substrates 42 and 43 can tolerate the chemical immersions 48, plasma 52 processes, and temperatures 47 to prepare the surfaces, as well as the bond quality and strength required for a given application.

In any of the bonding preparation and process alternatives described above, it is important to ensure that the processing is performed in a suitable clean room environment (class 10 or better, with class 1 preferred), and that the substrates are immediately physically contacted once they have been suitably prepared for pre-bonding. In addition, the substrate handling equipment, substrates fixtures, or anything the substrates come into contact with must be extremely clean and completely void of any contaminants. It is also preferred that the substrates are not placed or stored near any plastic containers or plastic substrate handling equipment since this can leave a hydrocarbon contamination on the surface that will degrade bonding. The substrates must be immediately bonded after the surfaces have been prepared, since the surface preparation process will activate the surface with charges that will pull particulates and aerosols from the surrounding air or environment which will significantly degrade the bond quality and strength. The ultra-clean room environment is required for bonding for the same reason—the substrates will have less chance to pull particulates and aerosols from the surrounding environment in an ultra-clean room since there are less particulates and aerosols.

Another alternative is to perform the substrates preparation process mostly in a UHV chamber, including the physical contacting of the substrates. This will mostly eliminate the problem of exposing the substrates to the surrounding environment and the surfaces picking up particulates or becoming contaminated.

Alternatively, the bonding process may include any of the variations of plasma 52 activation treatments that are described above prior to the physical contacting of the substrates 42 and 43.

The methods described above will enable low-temperature bonding between a semiconductor substrate 42 and metal substrate 43 and can also be used to obtain a low electrical resistance across the bonded interface between a semiconductor 42 and metal substrate 43. However, in some cases further steps may be required to result in a sufficiently low resistance electrical conduction across the interface between the two materials. Therefore, additional processing steps may need to be incorporated into the processing recipes described above to allow low resistance electrical conduction across the interface.

It has been known that when two dissimilar materials, one of which is a metal and therefore highly electrically conducting and the other of which is a semiconductor and therefore partially conducting, are bonded together that electrical conduction across the interface may be hindered unless the bonding is followed by a high temperature anneal (>500 degrees Celsius) or the bonding is performed in a UHV chamber wherein the substrates are heated to above 500 degrees Celsius, or some other techniques are performed to reduce the electrical resistance across the bonded interface. One reason for the high resistance may be the presence of molecules that are absorbed from a gas or liquid phase the substrate surfaces are exposed to prior to pre-bonding which results in a thin insulator layer between the substrates.

Although the molecules absorbed on the surface will vary depending on what the substrate was previously exposed to, these molecules can be of the variety of Hydrogen, Oxygen, Water or OH— molecules. For example, if the semiconductor was immersed in a Hydrofluoric (HF) acid to strip the native oxide and make the surface hydrophobic prior to bonding, there will be absorbed Hydrogen left on the surface of the semiconductor (i.e., Si—H on the substrate surface in the case of a Silicon substrate). Similarly, Oxygen or OH— molecules absorbed on the surface may result in the formation of an oxide layer, which will act as an insulator across the interface. Therefore, in order to obtain a low-resistance interface when bonding two dissimilar materials such as a semiconductor substrate 42 and a metal substrate 43, there are several process variations that may need to be performed.

One method to overcome these absorbed species on the surface is based on the knowledge that Boron in most semiconductor surfaces is strongly passivated by Hydrogen, thereby resulting in B—H complexes and that the Hydrogen can be released from these complexes at a relatively low temperatures (below 200 degrees Celsius).

Therefore, to ensure low resistance electrical conductance across the interface between a bonded semiconductor substrate 42 and a metal substrate 43, a method can be used which involves the intentional introduction of Boron into the semiconductor surface; that is, dope the surface of the semiconductor with Boron using either diffusion or ion implantation. Using this method, which is shown in FIGS. 8(a)-(e), the Boron 55 is introduced into semiconductor substrate 42 prior to the cleaning and surface activation steps of the substrate surfaces 44 and 45. Thus, the doped semiconductor 42 is immersed in a cleaning solution 57 suitable for the semiconductor material used, while the metal substrate 43 is immersed in a solution 59 suitable for the metal material used. The presence of Boron is thought to considerably weaken the bonding between the semiconductor material and Hydrogen, thereby leading to a reduction in the activation energy for the release of the Hydrogen absorbed on the surface 44. Finally, after rinsing and drying the substrates 42 and 43, the substrates 42 and 43 are then physically contacted (FIG. 8(d)) and then exposed to an elevated temperature 47 to anneal and bond them together, after which the bonded substrates 42 and 43 are cooled. A normal force 46 may also be applied to the contacted substrates 42 and 43 in order to facilitate the surfaces 44 and 45 of the substrates 42 and 43 come together during the physical contacting step or during the annealing step.

Another method to ensure low resistance electrical conductance across the interface between a bonded semiconductor substrate and a metal substrate is to deposit a metal that readily reacts or alloys with the semiconductor substrate at low temperatures. For example, it is known that Palladium (Pd) is an elemental metal that readily reacts with elemental semiconductors (e.g., Silicon, Germanium, etc.) as well as compound semiconductors (e.g., Gallium Arsenide, Indium Phosphide, etc.) at very low temperatures (e.g., less than 200 degrees Celsius). Moreover, it is also known that the Palladium will displace any native oxides on the surfaces of semiconductors while not oxidizing itself to create its own unwanted native oxide. Gold is also known to react or alloy with certain semiconductor materials.

Figure 9A:
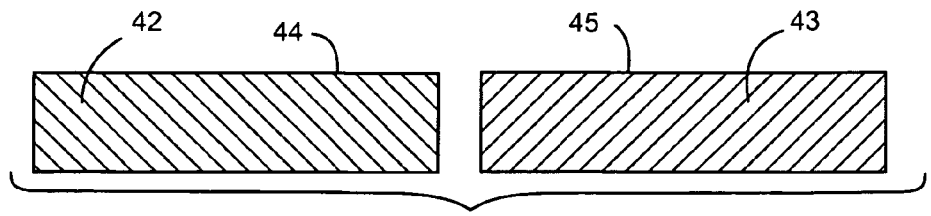
FIGS. 9(a)-(f) are cross-sectional views illustrating a technique to deposit a very thin layer of metal, such as Palladium, Gold, or other suitable material or combination of metal material layers, on the surface of the semiconductor substrate prior to bonding in order to obtain a low electrical and thermal resistance across the interface between a bonded semiconductor substrate and metal substrate.
Figure 9B:
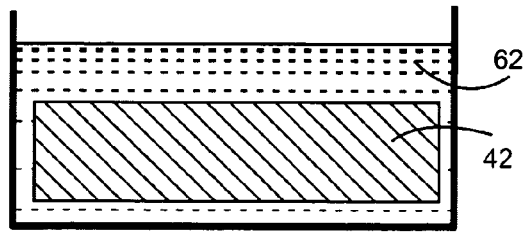
Figure 9C:
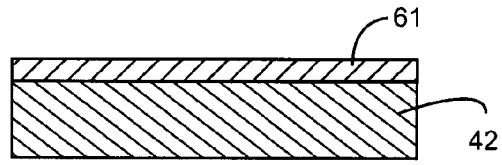

Therefore, FIGS. 9(a)-(f) illustrate another method to ensure low resistance electrical conductance across the interface between a bonded semiconductor substrate 42 and a metal substrate 43, in which a thin layer (e.g., few tens to few thousand Angstroms thick) of Palladium and/or Gold 61 is deposited on the surface 44 of the semiconductor substrate 42 after the surface 44 has been suitably cleaned and prepared to ensure that all contaminants have been removed from the surface 44 and the surface is sufficiently flat and smooth, as discussed above with respect to FIGS. 4(a)-(l). Thus, as shown in FIG. 9(a), the substrate surfaces 44 and 45 are sufficiently lapped and polished, after which the semiconductor substrate 42 is immersed, as shown in FIG. 9(b), in an cleaning solution 62 suitable for the semiconductor substrate 42 material.

Figure 9D:
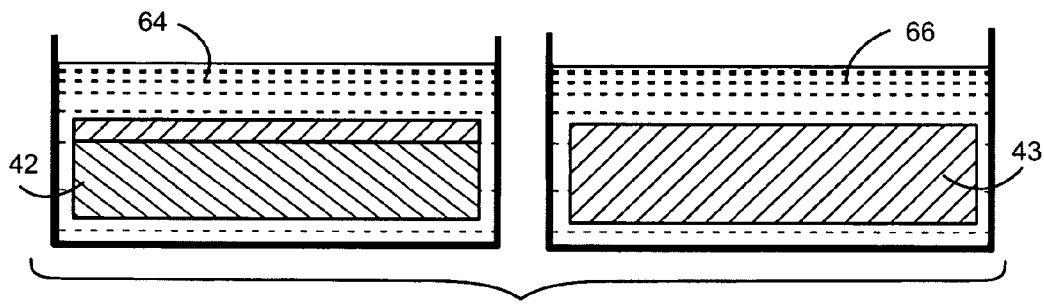
Figure 9E:
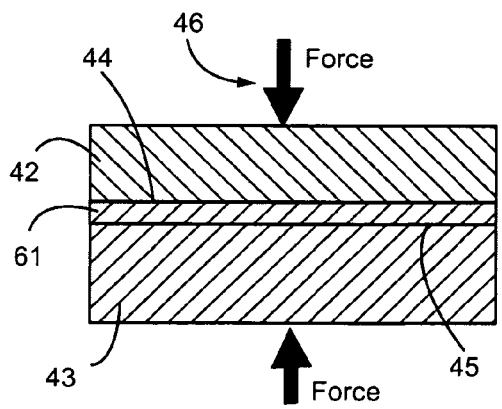
Figure 9F:
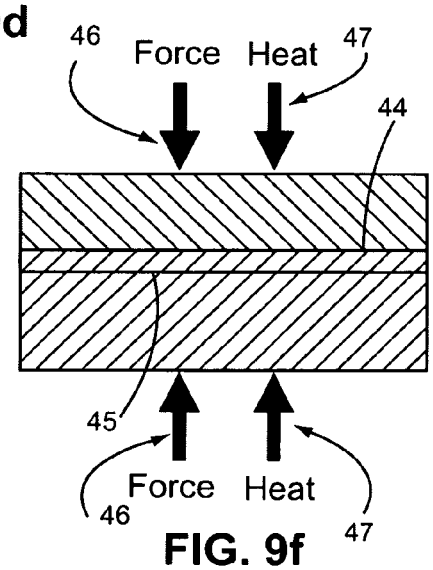

The cleaning and surface preparation of the semiconductor substrate 42 may be optional, depending on the technique used to deposit the Palladium 61. For example, if the Palladium 61 is deposited using sputtering, the surface 44 of the semiconductor substrate 42 can be back-sputtered (taking care not to damage the surface) prior to the deposition on the palladium layer to adequately clean the surface and remove all contaminants. After the deposition of the Palladium 61 on the surface 44 of the semiconductor substrate 42 (FIG. 9(c)), the semiconductor and metal substrates 42 and 43 may then be cleaned and prepared using an immersion in a suitable solution, as depicted in FIG. 9(d). For the semiconductor substrate 42, an cleaning solution 64 suitable for the semiconductor material and Palladium is used. For the metal substrate 43, acidic or basic aqueous solution 66 suitable for the metal material is used. For a weakly acidic solution, preferably the solution will contain either Acetic, Hydrochloric, Nitric acid, or a mixture of these, again selected based on its suitability for the given materials. The substrates 42 and 43 will then be rinse with DI water and dried. Next the semiconductor and metal substrates 42 and 43 are physically contacted and pressed together using a moderate amount of normal force 46 (e.g., a few PSI), as shown in FIG. 9(e). The pre-bonded substrates 42 and 43 will then be annealed at a temperature with the application of heat 47 of between slightly above room temperature to over 200 degrees Celsius to complete the bonding, as shown in FIG. 9(f). The bonded substrates 42 and 43 are then cooled. Optionally, a force 46 may be applied to the substrates during the anneal to facilitate the bonding.

Other metals may be deposited on the surface 44 of the semiconductor substrate 42 as a substitute or in addition to the Palladium 61. For example, any of the metals from the periodic table nearby Palladium may be substituted, including: Gold, Cobalt, Nickel, Copper, Rhodium, Silver, Iridium, and Platinum, as well as any combination of these metals.

Alternatively, the thin layer of metal of Palladium 61 or some other suitable metal material may be deposited onto the metal substrate 43 prior to the bonding process. Alternatively, the thin layer of metal of Palladium 61 or some other suitable metal material may be deposited onto both the semiconductor 42 and the metal substrate 43 prior to the bonding process. In either case, the rest of the bonding process would be performed as described above.

It is important to note that some or all of the other surface preparation and activation techniques discussed above may be used in addition to the deposition of a thin layer of Palladium 61 on the surface 44 of the semiconductor substrate 42 to facilitate bonding at low temperatures, while also obtaining a low-electrical resistance across the interface between the semiconductor and metal substrates 42 and 43.

It is also important to note that when attempting to obtain a low resistance across the interface of a semiconductor substrate bonded to a metal substrate, that an ohmic contact to the semiconductor substrate is required across the interface. That is, the energy band structure must be such that an energy barrier (i.e., a Schottky barrier) is not created across the semiconductor/metal junction. An ohmic contact is one where the current-voltage (I-V) curve of the junction is linear and symmetric. A non-linear and non-symmetric IV curve across the interface is termed blocking or a Schottky contact. There are a number of methods for ensuring that an ohmic contact is obtained when bonding a semiconductor substrate to a metal substrate. One method is to "degenerately" dope the semiconductor at its surface, that is, to introduce a very high concentration of dopants into the semiconductor substrate at the surface, such that the semiconductor behaves more like a metal than a semiconductor. Degenerate doping of semiconductors can be done by diffusion, ion implantation, as well as any of the means commonly used to introduce dopants into semiconductors. The type of dopant used will depend on the type of semiconductor, as well as the background doping. For example, Boron is a commonly used p-type dopant for silicon and can be used in high concentration to degenerately dope the silicon at the surface. This was described in FIGS. 8(a)-(e).

Another method for achieving an ohmic contact at the interface between the semiconductor and metal substrate 42 and 43 is to form a silicide at the surface of the semiconductor substrate. Silicides are formed by depositing a transition metal onto the surface 44 of a semiconductor substrate 42, followed by an annealing. In the case when the semiconductor substrate 42 is silicon, ohmic contacts can be made by deposition of a metal 61 that reacts with the silicon to form a silicide. Such a metal would include Palladium, Titanium, Tungsten, Platinum, Aluminum, Aluminum-Silicon, and others. Gold can also be used. However care must be taken to ensure that any electronic or photonic devices in the semiconductor substrate are not degraded when in the presence of Gold or other metals 61 that result in traps in the semiconductor bandgap. Other materials for making ohmic contact contacts can be used for other types of semiconductors.

Formation of contacts to compound semiconductors is considerably more difficult than with silicon. For example, Gallium Arsenide (GaAs) surfaces tend to lose arsenide on the surface where a metal is deposited. Moreover, the volatility of Arsenide (As) limits the time and temperature of post-deposition annealing GaAs semiconductors can tolerate. In the case of GaAs, deposition of Palladium, Gold, Gold-Germanium, Palladium-Germanium, Titanium-Platinum-Gold, and others can be deposited onto the semiconductor prior to bonding to ensure an ohmic contact between the semiconductor and metal substrates 42 and 43.

Another solution for making ohmic contacts to many compound semiconductors, including GaAs, is to deposit a low-bandgap alloy contact layer on the surface. For example, GaAs itself has a smaller bandgap than AlGaAs and so a layer of GaAs near its surface can promote ohmic behavior.

Alternatively, a thin metal layer of Palladium, Gold, Gold-Germanium, Palladium-Germanium, Titanium-Platinum-Gold, and others can be deposited onto the smaller bandgap semiconductor material prior to bonding to ensure an ohmic contact between the semiconductor and metal substrates.

When these thin films layers are deposited to facilitate a low electrical resistance interface across the bonded interface between the semiconductor substrate 42 and the metal substrate 43, the process is essentially as described in FIGS. 9(a)-(f), wherein the layer 61 of Palladium can be replaced or used in conjunction with another thin film material layer prior to bonding.

Figure 10A:
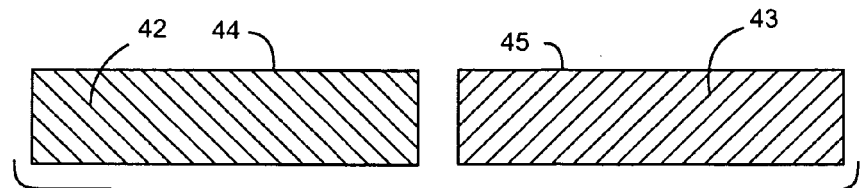
FIGS. 10(a)-(e) are cross-sectional views illustrating a technique to activate the surfaces using pulsed laser radiation of the substrates prior to physically contacting them in order to reduce the bonding temperature to obtain a high strength bond.
Figure 10B:
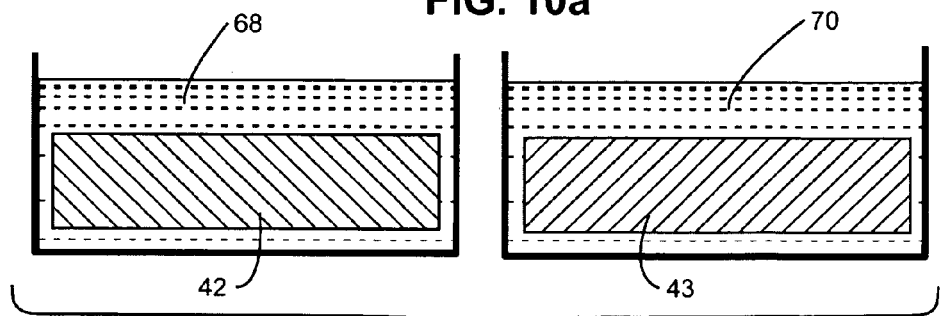
Figure 10C:
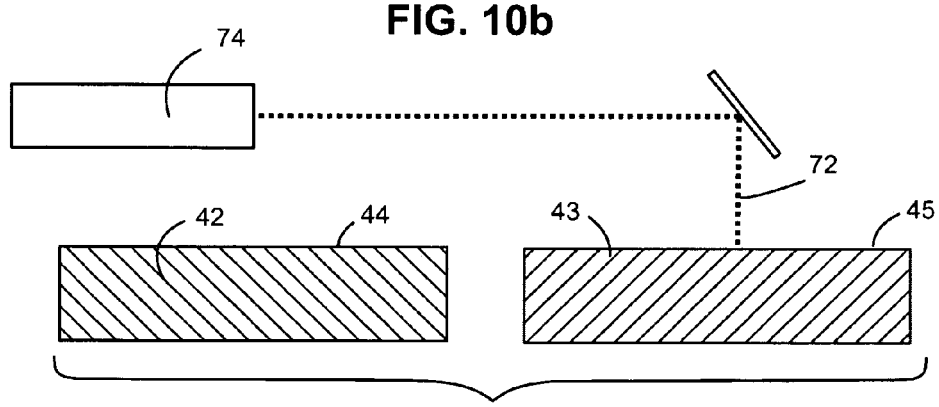
Figure 10D:
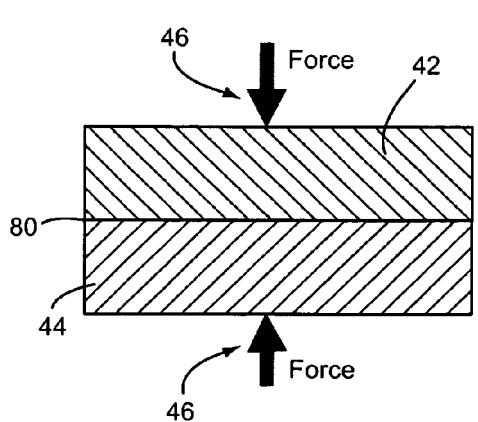
Figure 10E:
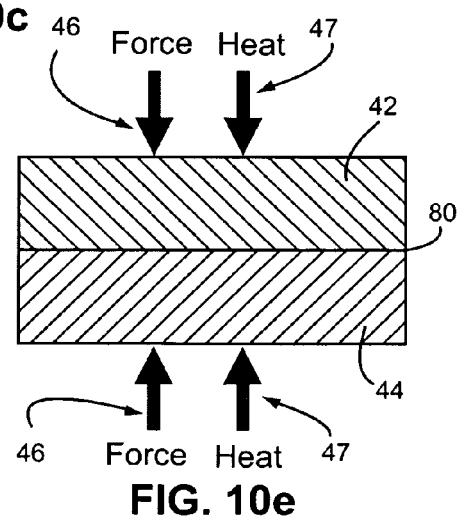

Yet another method for the bonding of a semiconductor and a metal is to use a laser scanning activation process instead of or in addition to a plasma activation process of the semiconductor 44 and metal 45 surfaces immediately prior to physically contacting them, as shown in FIGS. 10(a)-(e). Optionally, only the semiconductor surface can be irradiated and the metal surface not irradiated prior to pre-bonding. The method shown in FIGS. 10(a)-(e) involves activating the surfaces 44 and 45 of semiconductor and metal substrates 42 and 43 prior to physically contacting them in order to reduce the bonding temperature needed to obtain a high strength bond. As shown in FIGS. 10(a) and (b), the substrate surfaces 44 and 45 are first sufficiently lapped and polished and then sufficiently cleaned using appropriate cleaning solutions 68 and 70. As shown in FIG. 10(c), substrate surfaces are then scanned with the laser beam 72 of a femto-second laser 74.

The scanning of the substrate surfaces 44 and 45 is done using a pulsed femto-second laser 74 with a power level below that which results in damage to the surfaces 44 and/or 45 or below the level at which ablation of material occurs from such surfaces, but which heats the material immediately at the surface to between 400 and 1000 degrees Celsius in a very short period of time (i.e., less than 100 nanoseconds). The laser scanning may be performed in a vacuum environment. Due to the relatively low thermal conductance of the material irradiated and the short pulse durations of the laser beam 72, the temperature of the material in the irradiated substrate slightly below the surface of where the laser beam is scanning will remain at or near the ambient temperature (i.e., 25 degrees Celsius). The effect of the laser energy on the surface is to remove any absorbed species on the surface as well as to activate the surface, so as to make it more reactive. Any type of laser 74 can be used, including gas or solid state lasers. Moreover any wavelength of laser 74 can also be used from infrared to near ultra violet (UV). The energy dose to the substrates 42 and 43 for laser activation depends on the material from which the substrates 42 and 43 are made and the wavelength of the laser 74. After the substrates 42 and 43 have been scanned with the femto-second laser 74, they are physically contacted (FIG. 10(d)) with a normal force applied 46 and annealed with heat 47 to an elevated temperature to complete the bonding (FIG. 10(e)). Optionally, a force 46 may be applied to the substrates during the anneal in order to facilitate the bonding. Optionally, the substrates may be immersed in a solution to allow activation of the surfaces with molecular species prior to physical contacting, as described above.

Figure 11A:
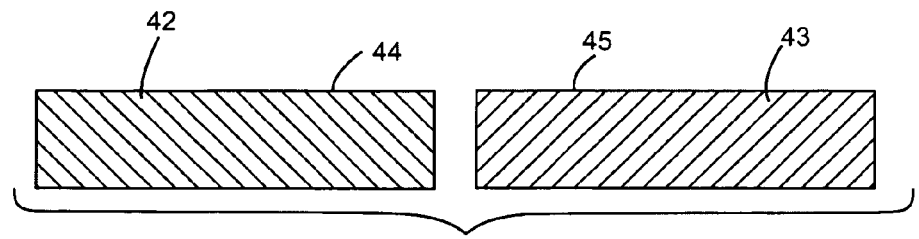
FIGS. 11(a)-(d) are cross-sectional views illustrating a technique to selectively heat the interface between the substrates using microwave energy thereby reducing the bonding temperature of the composite bonded substrate pair while also obtaining a high strength bond.
Figure 11B:
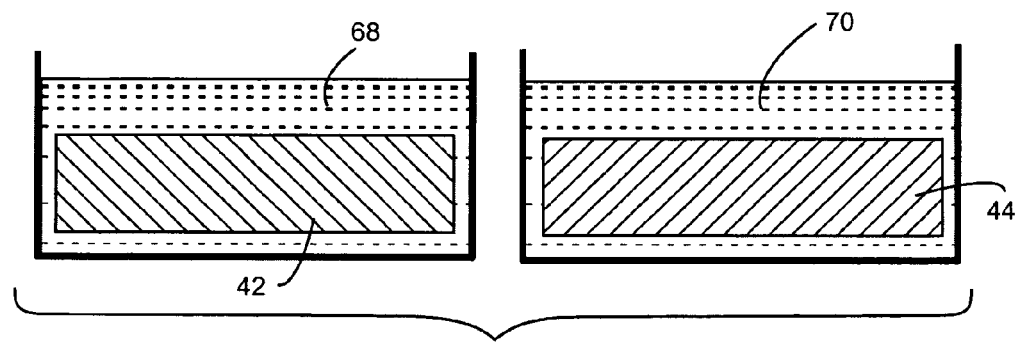
Figure 11C:
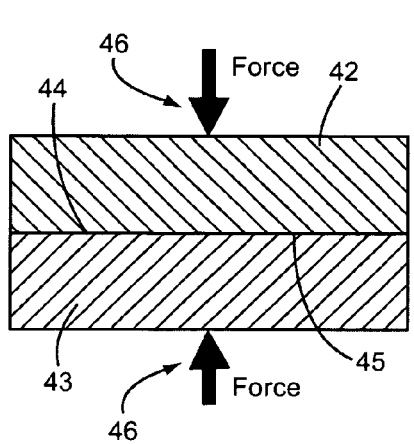
Figure 11D:
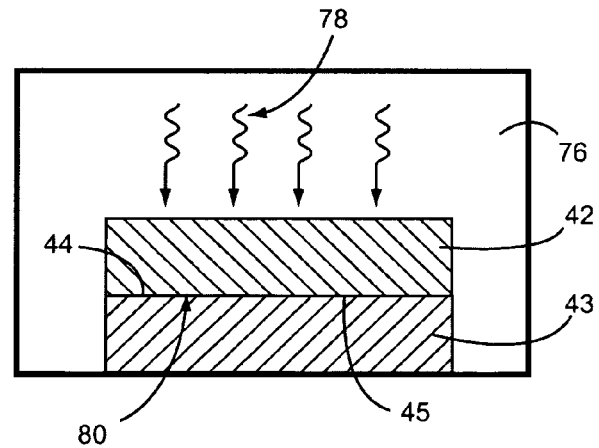

Yet another method for the bonding of a semiconductor and a metal is to use a process to selectively heat the interface between the semiconductor and metal substrates, a shown in FIGS. 11(a)-(d). Specifically, the semiconductor substrate 42 and metal substrate 43 are both prepared as described above to ensure that they are sufficiently flat, smooth and clean for bonding as described in FIG. 4(a)-(l). Thus, as shown in FIGS. 11(a) and (b), the substrate surfaces 44 and 45 are sufficiently lapped and polished and are sufficiently cleaned. For the semiconductor substrate 42, an cleaning solution 68 suitable for the semiconductor material is used, while for the metal substrate 43, a solution 70 suitable for the metal material is used (FIG. 11(b)). Subsequently, the substrates 42 and 43 are physically contacted (i.e., pre-bonded) (FIG. 11(c)) and a normal force 46 is applied to facilitate the substrates 42 and 43 to come together. The pre-bonded substrates 42 and 43 are then placed into a microwave cavity 76, whereby the substrates 42 and 43 are exposed to an elevated temperature to anneal and bonded together by means of a microwave beam 78 that is directed at the semiconductor metal interface 80 from the side of the semiconductor (FIG. 11(d)). A normal force 46 may be applied to press the substrates 42 and 43 together during the physical contacting and/or during the microwave beam 78 exposure. The bonded substrates 42 and 43 are then cooled.

The microwave chamber 76 is preferably evacuated, but can be filled with a non-reactive gas. The absorption of the microwave energy in the semiconductor substrate 42 is relatively minimal, while the absorption of the microwave energy in the metal substrate 43 can be substantial. Moreover, the microwave energy 78 will be absorbed in the metal substrate 43 to a depth approximately equal to the skin depth of the material at the respective microwave beam 78 frequency. Therefore, the semiconductor substrate 42 will not heat up due to the microwave beam 78 absorption, while the metal substrate 43 near the interface 80 will heat up substantially, thereby facilitating the bonding process.

Alternatively, an activation process using either of the methods described above (i.e., plasma activation or laser activation) can be used to additionally prepare the surfaces prior to physically contacting them and irradiating the microwave beam 78.

Alternatively, the surface 44 of the semiconductor substrate 42 can have Boron diffused or implanted into the surface to additionally prepare the surfaces prior to physically contacting them and irradiating them with microwave beam 78.

Alternatively, the thin layer of reactive metal such Palladium and/or Gold 61 or a similar metal as described above can be deposited on the surface of the semiconductor substrate 42 to additionally prepare the surface 44 prior to physically contacting the semiconductor substrate 42 to the metal substrate 43 and irradiating them with microwave beam 78, thereby facilitating the formation of an ohmic contact across the bonded interface 80 between the substrates 42 and 43.

Alternatively, the semiconductor substrate 42 can have a thin layer of transitional metal 61 applied to the surface 44 and annealed to form an alloy or silicide at the surface to additionally prepare the semiconductor surface 44 prior to physically contacting the semiconductor and metal substrates 44 and 45 together and irradiating them with microwave beam 78 so as to form a ohmic contact across the bonded interface 80.

Alternatively, the metal substrate 43 can have a thin layer of metal, such as Palladium 61 or Gold, applied to the surface 45 to additionally prepare the metal surface 45 prior to physically contacting the semiconductor and metal substrates 44 and 45 together and irradiating them with microwave beam 78 so as to form an ohmic contact across the bonded interface 80.

Alternatively, the metal substrate 43 and the semiconductor substrate 42 can have a thin layer of transitional metal 61 applied to the surfaces 45 and 44 to additionally prepare the metal and semiconductor surfaces 45 and 44 prior to physically contacting the semiconductor and metal substrates 42 and 43 together and irradiating them with microwave beam 78 so as to form an ohmic contact across the bonded interface 80.

Alternatively, the semiconductor substrate 42 can be degenerately doped with an appropriate dopant at the surface to additionally prepare the semiconductor surface 44 prior to physically contacting the semiconductor and metal substrates 44 and 45 together and irradiating them with microwave beam 78 so as to form a ohmic contact across the bonded interface 80.

Alternatively, any combination of plasma and/or laser activation of the substrate surface 44, Boron diffusion or implantation into the substrate surface 44, or thin film metal 61 deposition (such as Palladium, Gold, or a similar metal) to form an alloy or silicide at the surface 44 and/or 45, or degenerate doping at the surface 44 can be performed on the semiconductor substrate 42 and/or the metal substrate 43 to additionally prepare the surfaces 44 and 45 prior to physically contacting them and irradiating them with microwave beam 78.

FIGS. 12(a)-(d) show another method for achieving low-temperature bonding between a semiconductor substrate 42 and a metal substrate 43. The substrates surfaces 44 and 45 are prepared to ensure that they are made sufficiently smooth, flat and clean according to the methods described in FIGS. 4(a)-(l) and illustrated in FIG. 12(a). Subsequently, the surfaces 44 and 45 of the substrates 42 and 43 may then be activated using any of the methods previously described including chemical immersion, plasma exposure, and/or laser exposure as shown in FIG. 12(b). The substrates may also have a thin metal layer of Palladium and/or Gold 61, or similar metal on the surface of the semiconductor substrate 42 and/or the metal substrate 43 prior to bonding. The substrates 42 and 43, as shown in FIG. 12(c) are then physically contacted with a normal force 46 applied to facilitate the substrates 42 and 43 coming together. Subsequently, as shown in FIG. 12(d) the substrates 42 and 43 are then exposed to an ultrasonic acoustical energy beam 79 with the simultaneous application of a normal force 46, and optionally heat can be applied 47 to the substrates 42 and 43, to bond the substrates 42 and 43 together. The application of the ultrasonic energy allows the bonding temperature to be reduced while obtaining a high quality and high strength bond. The presence of a metal layer such as Palladium and/or Gold 61, or similar metal, allows an ohmic contact to be formed across the interface 80 of the two bonded substrates 42 and 43.

A preferred embodiment of the process to bond a semiconductor substrate to a metal substrate will be described. Specifically, we describe a method for the low-temperature bonding of a GaAs substrate low-temperature to a metal substrate in which the metal substrate has three functions, i.e., as a heat sink; as an electrode to supply current to the active devices in the GaAs substrate; and, as a mechanical support for the fragile GaAs substrate.

Figure 13A:
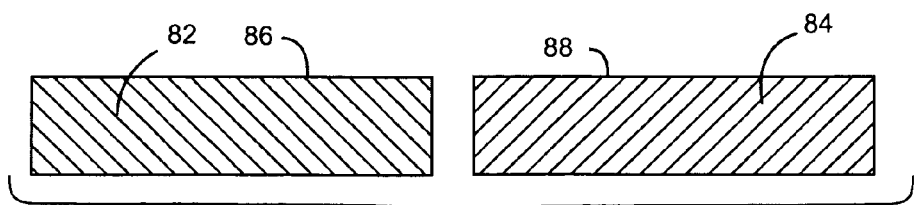
FIGS. 13(a)-(e) are cross-sectional views illustrating a bonding process for bonding a Gallium Arsenide (GaAs) substrate to a metal substrate.
Figure 13B:
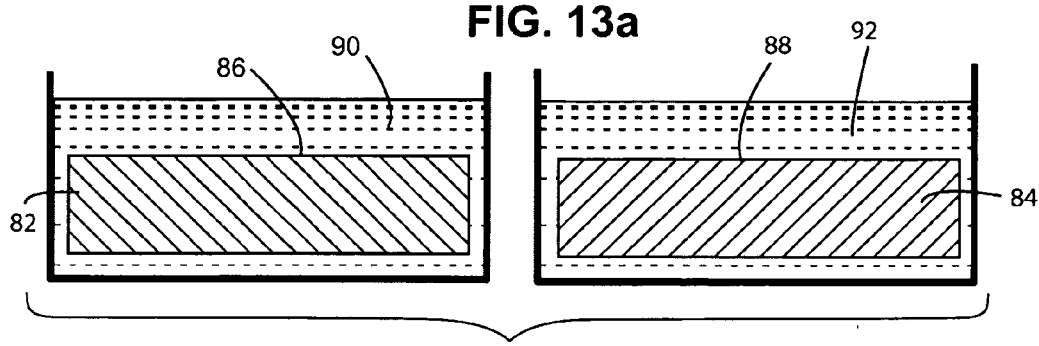

FIGS. 13(a)-(e) illustrate the bonding process for bonding a Gallium Arsenide (GaAs) semiconductor substrate 82 to a metal substrate 84. The GaAs substrate 82 may have opto-electronic devices fabricated in it. As shown in FIG. 13(a), the substrate surfaces 86 and 88 are first sufficiently lapped and polished as described above. Next, as shown in FIG. 13(b), the substrate surfaces 86 and 88 are cleaned and prepared using suitable solutions 90 and 92 for the GaAs substrate 82 and the metal substrate 84 that is used, respectively. The cleaning procedure for Gallium Arsenide (GaAs), a compound semiconductor material used in opto-electronic applications will involve the removal of organic and metal contaminates from surface 86, as well as the removal of any oxides on the surface 86, as follows. An organic solvent solution can be the solution 90 used to clean the surface of 86 of the GaAs substrate 82 of organic contamination. For example, one mixture involves a multiple step process consisting of: (1) immersion in boiling trichloroethane1,1,1 (TCE) for 5 to 15 minutes; (2) Immersion in boiling acetone for 5 to 15 minutes; (3) Immersion in methanol at room temperature for 5 to 15 minutes; and lastly, (4) Immersion in isopropanol (IPA) for 5 to 15 minutes at room temperature. Ultrasonic agitation may also be used to facilitate the cleaning process for one or more of the immersion steps in this recipe.

Similarly, the solution 92 used to clean the metal substrate 84 is selected so as to be compatible with the material from which the metal substrate 84 is made.

Figure 13C:
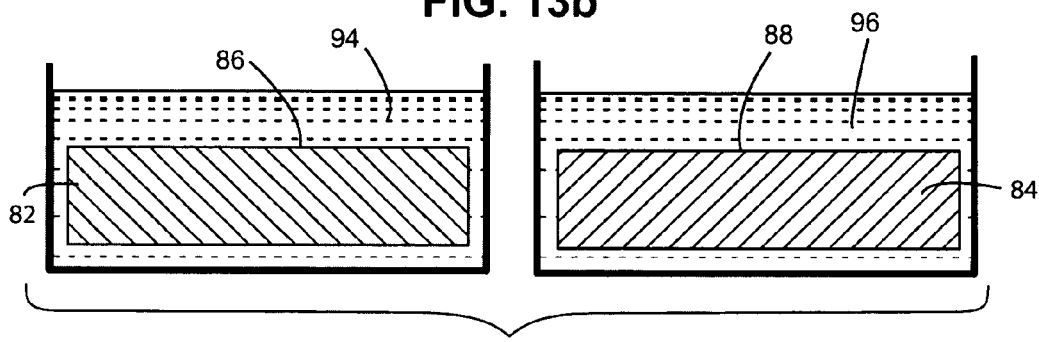

Next, as shown in FIG. 13(c), any native oxides on the substrate surfaces 86 and 88 are removed using appropriate solutions 94 and 96. The removal of any native oxide on the surface 86 of the GaAs substrate 82 is extremely important to ensure that the interface 98 between the bonded GaAs substrate 82 and the metal substrate 84 is electrically conducting. Therefore, immersion of the GaAs substrate 82 in a solution 94 having a mixture of NH4OH and H2O in the approximate proportions ranging from 10:1 to 20:1 for 1 to 5 minutes under agitation or irrigation will remove the native oxide on the surface 86 of substrate 82 prior to bonding.

Alternatively, solution 94 could be a dilute acidic mixture, such as HCl and H2O in the proportions of 1:1, or a mixture of H3PO4 and H2O in the proportions of 1:1, or a mixture of H2SO4 in H2O in the proportions of 1:1, which will also be sufficient to remove the native oxide on the surface of the GaAs substrate surface 86 prior to bonding. Alternatively, other solutions 94 may be used that are known to remove native oxides from the surfaces 86 of GaAs substrates 82.

To bond the GaAs substrate 82 to a metal substrate 84, the metal substrate 84 must also be properly cleaned and prepared prior to bonding. The exact type of cleaning solution 96 used will depend on the type of metal or metal alloy substrate 84 to be bonded to the GaAs semiconductor substrate 82. But, for the case of bonding a GaAs substrate 82 to a copper (Cu) or a copper-tungsten (CuW) substrate 84, the cleaning would first involve removal of any organic contamination on the surface using the organic contamination recipe described above followed by the removal of native oxides using an immersion Acetic Acid (CH3COOH) at a concentration of up to a 4 vol % water dilution at 35 degrees Celsius for a few minutes.

Figure 13D:
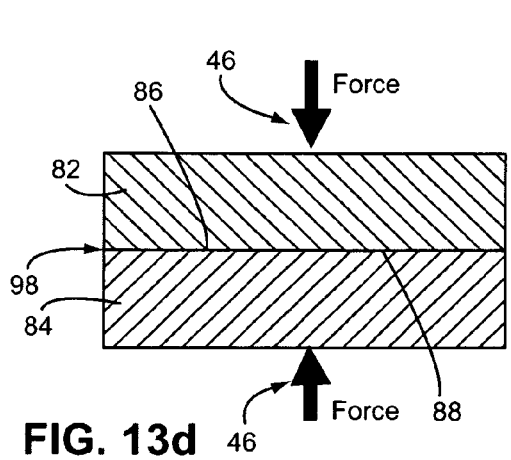

Next, the two substrates 82 and 84 are rinsed and dried using an appropriate method and then physically contacted to pre-bond them together, as shown in FIG. 13(d). The method of drying depends on the exact type of substrates to be bonded, but will usually involve the blowing of an inert gas across the substrate surfaces 86 and 88 to force any liquid to be removed, or placing the substrates 82 and 84 in a vacuum to evaporate any remaining liquids from the surfaces 86 and 88.

The substrates 82 and 84 are then physically contacted by placing the polished surfaces 86 and 88 of the two substrates 82 and 84 together and then a normal force 46 can be applied to facilitate the bonding process. The substrates 82 and 84 can be aligned prior to the physical contacting to register the features or devices on one substrate to the features or devices on the other substrate.

Figure 13E:
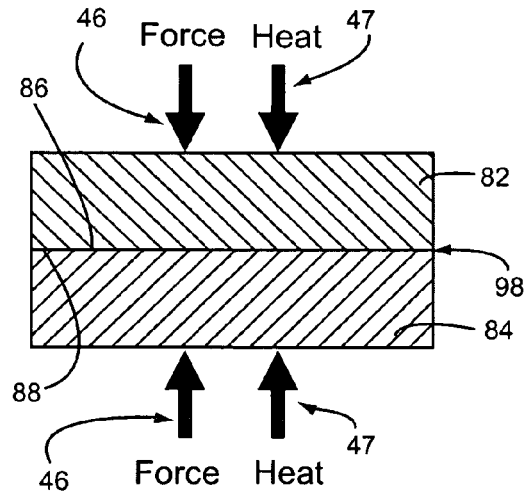

Lastly, the pre-bonded substrates 82 and 84 are annealed at an elevated temperature by the application of heat 47 to strengthen the bond between the substrates 82 and 84, as shown in FIG. 13(e). This annealing is performed in a non-oxidizing ambient gas (e.g., Nitrogen, Argon, or similar gas) at a temperature ranging from slightly higher than room temperature to over 100 degrees Celsius or higher and for a time of 5 minutes or longer. The bonded substrates 82 and 84 are then cooled. Optionally, a force 46 may be applied during the anneal to facilitate the substrate bonding.

Alternatively, an activation process, using either of the methods described above (i.e., plasma activation or laser activation) can be used to additionally prepare the surfaces 86 and 88 prior to physically contacting them and annealing them.

Alternatively, the surface 86 of the semiconductor substrate 82 can have Boron diffused or implanted into the surface 86 to additionally prepare the surfaces 86 and 88 prior to physically contacting them and annealing them.

Alternatively, a thin layer of metal such Palladium and/or Gold 61, or a similar metal as described above, can be deposited onto the surface 86 of the semiconductor substrate 82 to additionally prepare the surfaces 86 and 88 prior to physically contacting them and annealing them so as to obtain a low electrical resistance across the bonded interface 98 between the two substrates 82 and 84.

Alternatively, a thin layer of reactive metal that will alloy or form a silicide with the semiconductor can be deposited onto the surface 86 of the semiconductor substrate 82 to additionally prepare the surfaces 86 and 88 prior to physically contacting them and annealing them, so as to form an ohmic contact across the bonded interface 98.

Alternatively, a thin layer of metal such Palladium and/or Gold 61, or a similar metal as described above, can be deposited onto the surface 88 of the metal substrate 84 to additionally prepare the surfaces 86 and 88 prior to physically contacting them and annealing them so as to obtain a low electrical resistance across the bonded interface 98 between the two substrates 82 and 84.

Alternatively, a thin layer of metal such Palladium and/or Gold 61, or a similar metal as described above, can be deposited onto the surface 88 of the metal substrate 84 and the surface 88 of the semiconductor substrate 86 to additionally prepare the surfaces 86 and 88 prior to physically contacting them and annealing them so as to obtain a low electrical resistance across the bonded interface 98 between the two substrates 82 and 84.

Alternatively, the surface 86 of the semiconductor substrate 82 can be degenerately doped using an appropriate dopant species 55 to additionally prepare the surfaces 86 and 88 prior to physically contacting them and annealing them, so as to form an ohmic contact across the bonded interface 98.

Alternatively, any combination of plasma and/or laser activation of the substrate surface 86, Boron diffusion or implantation into the substrate surface 86, degenerate doping of the substrate surface 86, reactive metal deposition (such as Palladium and/or Gold 61, or a similar metal) onto the surface 86, or deposition of a thin layer of transition metal that will alloy or form a silicide at the semiconductor substrate surface 86 can be performed on the semiconductor substrate 82 to additionally prepare the surfaces 86 and 88 prior to physically contacting them and annealing them.

Alternatively, any combination of plasma and/or laser activation of the substrate surface 86, Boron diffusion or implantation into the substrate surface 86, degenerate doping of the substrate surface 86, reactive metal deposition (such as Palladium and/or Gold 61, or a similar metal) onto the surface 86, or deposition of a thin layer of transition metal that will alloy or form a silicide at the semiconductor substrate surface 86 can be performed on the semiconductor substrate 82 to additionally prepare the surfaces 86 and 88 prior to physically contacting them and the annealing can be performed using a microwave energy beam to selectively heat the interface 98 between the GaAs and metal substrates 82 and 84.

Alternatively, any combination of plasma and/or laser activation of the substrate surface 86, Boron diffusion or implantation into the substrate surface 86, degenerate doping of the substrate surface 86, reactive metal deposition (such as Palladium and/or Gold 61, or a similar metal) onto the surface 86, or deposition of a thin layer of transition metal that will alloy or form a silicide at the semiconductor substrate surface 86 can be performed on the semiconductor substrate 82 to additionally prepare the surfaces 86 and 88 prior to physically contacting them and the bonding can be performed using an ultrasonic acoustical energy beam to selectively heat the interface 98 between the GaAs and metal substrates 82 and 84.

Figure 14:
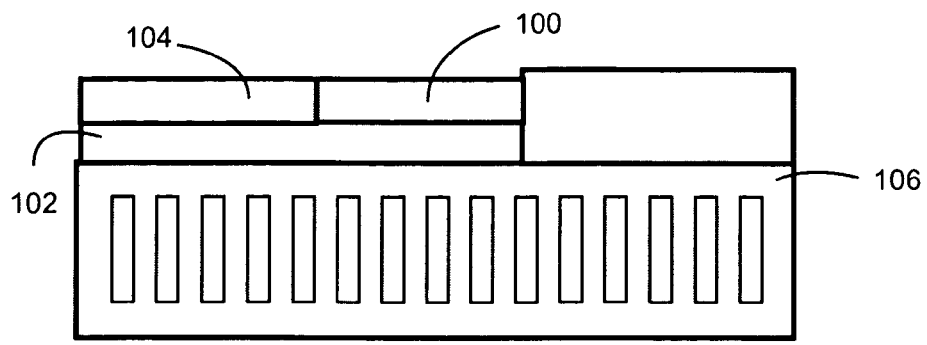
FIG. 14 is an illustration of bonding a semiconductor microelectronics die to a metal substrate and also bonding different types of semiconductor substrates with different functionalities, such as photonics and MEMS, to semiconductor and metal substrates, thereby realizing a merged multi-technology capability. In this example, the photonics device may be bonded to a silicon integrated circuits die for controlling the photonics device, which is bonded to a MEMS device that actively shutters the light propagating from the photonics substrate. These semiconductors are bonded onto a metal substrate which functions as both a heat sink and as an electrode to the semiconductor substrates.

FIG. 14 illustrates the use of the semiconductor to metal bonding method described herein to form a complex system that combines one or more semiconductor substrates or dies with a metal substrate. The semiconductor substrates could have any number of technologies fabricated into them, including, for example, microelectronics, photonics, and/or MEMS. The metal substrate can have one or more functions, including: a mechanical support; a heat sink (with cooling fins, heat pipes, capillary pumped loops, 2-phase cooler, spray coolers, etc.); electrodes to supply current and/or voltage to the semiconductor devices; and metal shielding to protect the active devices made in the semiconductor substrates. As shown in FIG. 14, a semiconductor substrate 100, with photonic devices fabricated in it, is bonded to a semiconductor silicon substrate 102, with microelectronics fabricated in it. Likewise, a semiconductor or metal substrate 104, with MEMS device(s) fabricated in it, is bonded to the microelectronics substrate 102. This composite stack of the three substrates, i.e., the photonics substrate 100, the microelectronics substrate 102, and the MEMS substrate 104, is then bonded to a metal substrate 106 on the bottom using the semiconductor to metal bonding method described herein. In this configuration, the metal substrate 106 acts as a heat sink and as an electrode and may have one or more of the following including: microchannel coolers, cooling fins, heat pipes, capillary pumped loops, two-phase cooler, spray coolers, etc. fabricated inside the metal substrate 106 to facilitate the removal of heat from the bonded semiconductor substrates 100, 102, and 104. It is understood that the configuration illustrated in FIG. 14 is only one of many possible configurations, and that the present invention, whereby multiple semiconductor and metal substrates can be bonded together to form complex systems, is exemplary of these possible configurations.

Figure 15A:
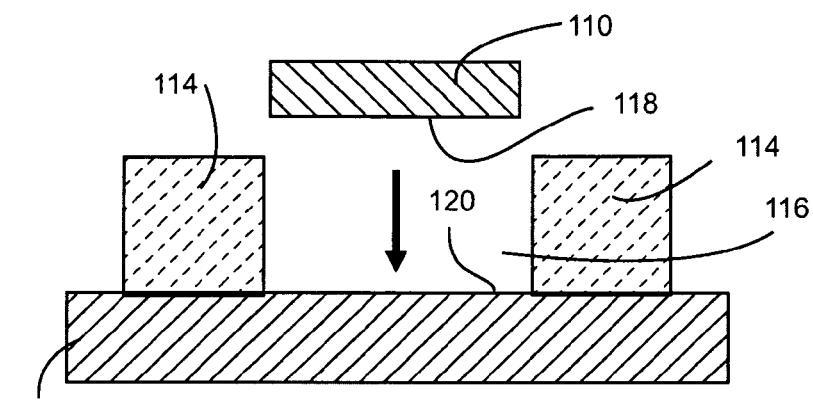
FIGS. 15(a)-(c) are cross-sectional views illustrating how the present invention can be used to package MEMS, photonics and microelectronic devices.
Figure 15B:
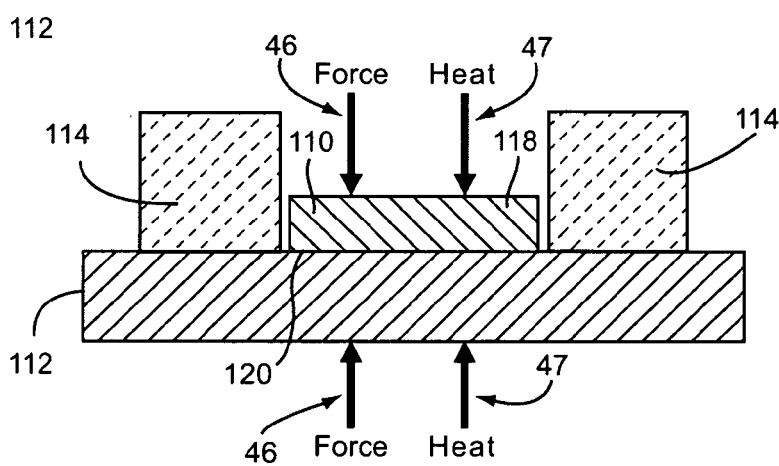
Figure 15C:
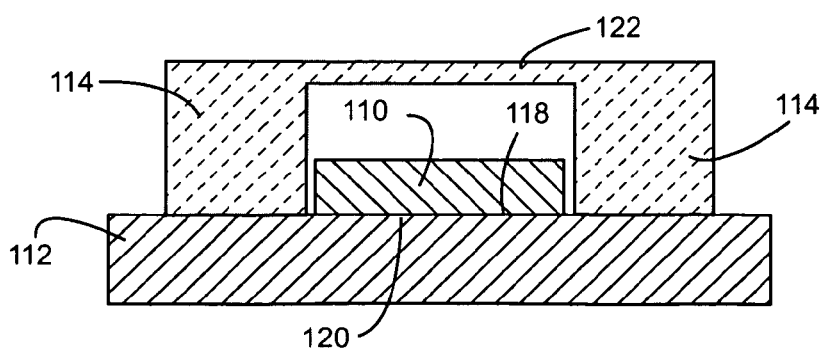

FIGS. 15(a)-(c) illustrate how the present invention can be used to package various semiconductor devices, including microelectronics, MEMS and/or photonic devices. As shown, a semiconductor substrate 110, having microelectronic, MEMS and/or photonics devices fabricated on it, is bonded without the use of any intermediate layers to a metal substrate 112 on which is formed a ceramic enclosure 114 so as to make a cavity 116 where the semiconductor substrate 110 is positioned. The process for bonding the semiconductor substrate 110 to the metal substrate 112 may use any one of the various cleaning and pre-bonding methods described above. The specific method used is selected on the basis of whether the bonding temperature must be kept below a certain temperature, whether electrical conduction is required between the semiconductor and metal substrates 110 and 112, and whether thermal conduction is required between the semiconductor and metal substrates 110 and 112. Thus, as shown in FIG. 15(a), the semiconductor die and metal substrate surfaces 118 and 120 are cleaned and prepared for bonding. As shown in FIG. 15(b), the semiconductor die and metal substrate surfaces 118 and 120 are bonded using a normal force 46 and an applied heat 47. As shown in FIG. 15(b), the semiconductor die and metal substrate surfaces 118 and 120 are annealed to bond them together.

Once the semiconductor substrate 110 has been bonded to the metal substrate 112, an enclosure 122 is placed over the cavity 116 in the package formed by the ceramic enclosure 114 and sealed to completely encapsulate the semiconductor substrate 110 within the enclosure 114. The walls and lid of the enclosure 114 are shown as made from a ceramic material in FIG. 14(c), but these elements can be made from any material, including metal, semiconductor, plastic, etc.

Figure 16A:
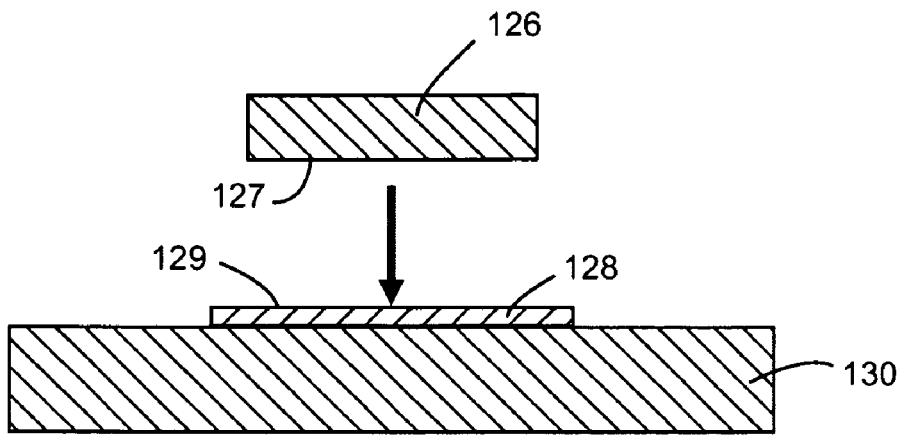
FIGS. 16(a)-(c) are cross-sectional views illustrating another configuration of the present invention in which a semiconductor device is bonded to a metal surface that has been fabricated on top of a semiconductor or ceramic substrate.
Figure 16B:
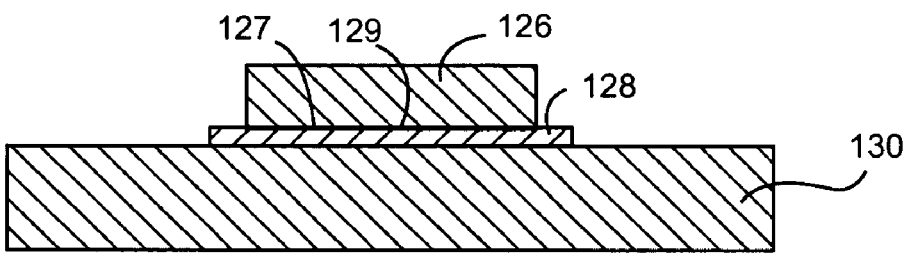
Figure 16C:
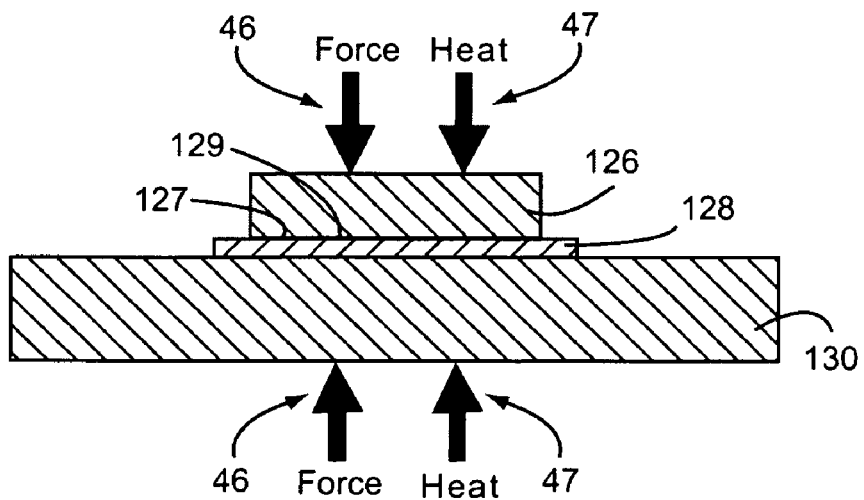

FIGS. 16(a)-(c) illustrate another configuration of the present invention in which a semiconductor device 126 is bonded to a metal surface 128 that has been fabricated on top of a metal, semiconductor, or ceramic substrate 130. Essentially, the semiconductor device 126 is bonded to the thin metal layer 128 that is fabricated on the metal, semiconductor, or ceramic substrate 130 prior to the bonding. The metal layer 128 may be patterned and etched so as to define electrical interconnections and electrodes that can be used to apply electrical current and voltage (i.e., power) to the semiconductor substrate(s) 126. The metal, semiconductor, or ceramic substrate 130 having a metal layer 128 on it, which is bonded to the semiconductor substrate 126, may function as an active or passive heat sink (e.g., having one or more of the following including microchannel coolers, cooling fins, heat pipes, capillary pumped loops, two-phase cooler, spray coolers, etc.) so as to remove waste heat from the semiconductor device made in the semiconductor substrate 126. As shown in FIG. 16(a), the surfaces 127 ad 129 of the semiconductor substrate 126 and metal layer 128 on the metal, semiconductor, or ceramic substrate 130 are cleaned and prepared for bonding. The surfaces 127 and 129 of the semiconductor substrate 126 and metal layer 128 on the metal, semiconductor, or ceramic substrate 130 are then pre-bonded, as shown in FIG. 16(b). Finally, the semiconductor substrate 126 and metal substrate 128 surfaces 127 and 129 are annealed and bonded, as shown in FIG. 16(c), by applying normal force 46 and/or heat 47 to the interface between metal layer 128 on metal, semiconductor, or ceramic substrate 130, and semiconductor substrate 126 having devices fabricated it for a specified period of time.

Alternatively, an activation process, using either of the methods described above (i.e., plasma activation and/or laser activation) can be used to additionally prepare the surfaces 127 and 129 prior to physically contacting them and annealing them.

Alternatively, the surface 127 of the semiconductor substrate 126 can have Boron diffused or implanted into the surface 127 to additionally prepare the surfaces 126 and 130 prior to physically contacting them and annealing them.

Alternatively, a thin layer of metal such Palladium and/or Gold 61, or a similar metal as described above, can be deposited onto the surface 127 of the semiconductor substrate 126 to additionally prepare the surfaces 126 and 130 prior to physically contacting them and annealing them so as to obtain a low electrical resistance across the bonded interface 129 between the two substrates 126 and 130.

Alternatively, a thin layer of reactive metal that will alloy or form a silicide with the semiconductor can be deposited onto the surface 127 of the semiconductor substrate 126 to additionally prepare the surfaces 127 and 129 prior to physically contacting them and annealing them, so as to form an ohmic contact across the bonded interface 129.

Alternatively, a thin layer of metal such Palladium and/or Gold 61, or a similar metal as described above, can be deposited onto the surface 129 of the metal layer 128 on top of the metal semiconductor, or ceramic substrate 130 to additionally prepare the surfaces 127 and 129 prior to physically contacting them and annealing them so as to obtain a low electrical resistance across the bonded interface 129 between the two substrates 126 and 130.

Alternatively, a thin layer of metal such Palladium and/or Gold 61, or a similar metal as described above, can be deposited onto the surface 129 of the metal layer 128 on top of the metal, semiconductor, or ceramic substrate 130 and the surface 127 of the semiconductor substrate 126 to additionally prepare the surfaces 126 and 129 prior to physically contacting them and annealing them so as to obtain a low electrical resistance across the bonded interface 129 between the two substrates 126 and 130.

Alternatively, the surface 127 of the semiconductor substrate 126 can be degenerately doped using an appropriate dopant species to additionally prepare the surfaces 127 and 129 prior to physically contacting them and annealing them, so as to form an ohmic contact across the bonded interface 129.

Alternatively, any combination of plasma and/or laser activation of the substrate surfaces 127 and 129, Boron diffusion or implantation into the substrate surface 127, degenerate doping of the substrate surface 127, reactive metal deposition (such as Palladium and/or Gold 61, or a similar metal) onto the surfaces 127 and 129, or deposition of a thin layer of transition metal that will alloy or form a silicide at the semiconductor substrate surface 127 can be performed on the semiconductor substrate 126 to additionally prepare the surfaces 127 and 129 prior to physically contacting them and annealing them.

Alternatively, any combination of plasma and/or laser activation of the substrate surfaces 127 and 129, Boron diffusion or implantation into the substrate surface 127, degenerate doping of the substrate surface 127, reactive metal deposition (such as Palladium and/or Gold 61, or a similar metal) onto the surfaces 127 and 129, or deposition of a thin layer of transition metal that will alloy or form a silicide at the semiconductor substrate surface 127 can be performed on the semiconductor substrate 126 to additionally prepare the surfaces 127 and 129 prior to physically contacting them and the annealing can be performed using a microwave energy beam to selectively heat the interface 129 between the semiconductor substrate 126 and the metal layer 128 on top of the metal, semiconductor, or ceramic substrate 130.

Alternatively, any combination of plasma and/or laser activation of the substrate surfaces 127 and 129, Boron diffusion or implantation into the substrate surface 127, degenerate doping of the substrate surface 127, reactive metal deposition (such as Palladium and/or Gold 61, or a similar metal) onto the surfaces 127 and 129, or deposition of a thin layer of transition metal that will alloy or form a silicide at the semiconductor substrate surface 127 can be performed on the semiconductor substrate 126 to additionally prepare the surfaces 127 and 129 prior to physically contacting them and the bonding can be performed using an ultrasonic acoustical energy beam to selectively heat the interface 129 between the substrates 126 and 130.

Figure 17A:
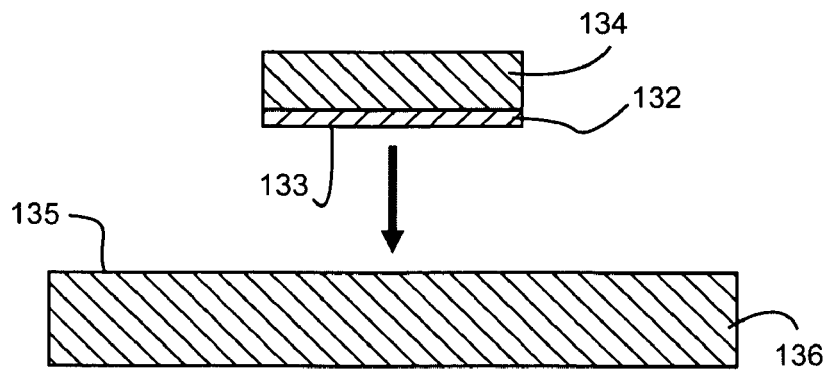
FIGS. 17(a)-(c) illustrate another configuration of the present invention whereby a metal layer has been fabricated onto the surface of a semiconductor which is then bonded to a semiconductor or ceramic substrate.
Figure 17B:
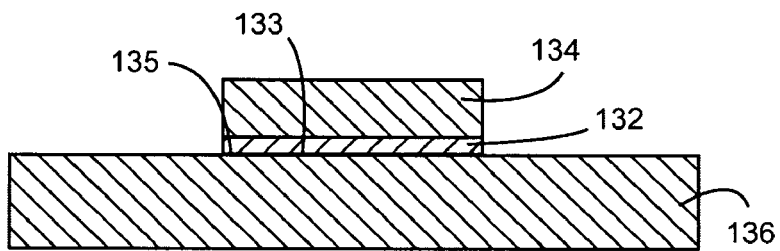
Figure 17C:
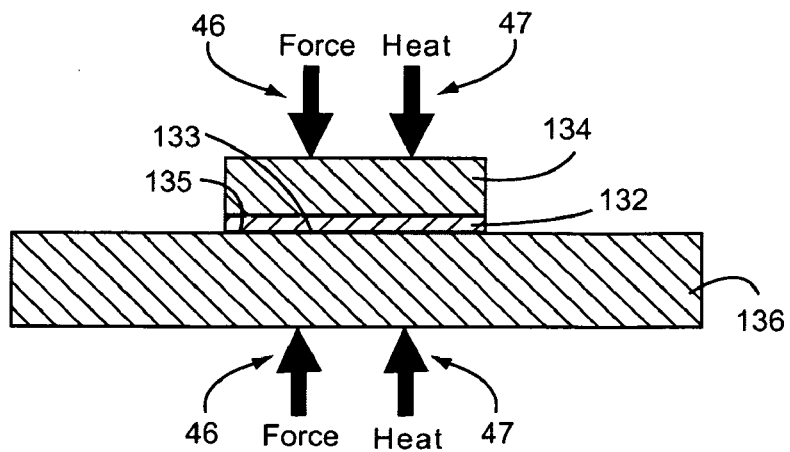

FIGS. 17(*a*)-(*c*) illustrate a variation of the configuration shown in FIGS. 16(*a*)-(*c*), wherein a metal layer 132 is fabricated onto a semiconductor device 134, which layer is then bonded to a metal, semiconductor, or ceramic substrate 136. The metal layer 132 fabricated on the semiconductor device 134 functions as electrical interconnections and as electrodes that enable electrical power to be delivered to the semiconductor device 134. As shown in FIG. 17(*a*), the surfaces 133 of metal layer 132 on the semiconductor device 134 and the surface 135 of the metal, semiconductor, or ceramic substrate 136 are cleaned and prepared for bonding as described above. Next, the surfaces 133 and 135 of the metal layer 132 and the metal, semiconductor, or ceramic substrate 136 are pre-bonded, as shown in FIG. 17(*b*). Finally, the surfaces 133 and 135 of metal layer 132 and the metal, semiconductor, or ceramic substrate 136 are annealed and bonded, as shown in FIG. 17(*c*), by subjecting the semiconductor device 134, metal layer 132 and metal, semiconductor, or ceramic substrate 136 to heat 47 and a normal force 46 for a specified period of time.

Waste heat from the semiconductor device 134 is removed by the metal, semiconductor, or ceramic substrate 136 that functions as an active or passive heat sink. For example, the metal, semiconductor, or ceramic substrate 136 may have cooling fins, heat pipes, capillary pumped loops, 2-phase cooler, spray coolers, microchannel coolers, etc. fabricated into it. Such an architecture has advantages in that it eliminates electrolysis action that metal microchannel coolers suffer from when they are both electrodes and active heat sinks. Electrolysis limits the lifetime of the device. Also, such a design does not require deionized water which is corrosive and needs additional equipment. Ceramics may have other advantages such as the ability of machining finer pore sizes, or using diamond in the case of passive waste heat removal. Diamond has an extraordinary high thermal conductivity, allowing large amounts of heat to be removed from the semiconductor device 134.

Likewise, as shown in FIGS. 16(*a*)-(*c*), waste heat from the semiconductor device 126 is removed by the metal, semiconductor, or ceramic substrate 130 that functions as an active or passive heat sink. For example, the metal, semiconductor, or ceramic substrate 130 may have microchannel coolers fabricated into it. Such an architecture has advantages in that it eliminates electrolysis action that metal microchannel coolers suffer from when they are both electrodes and active heat sinks. Electrolysis limits the lifetime of the device. Also, such a design does not require deionized water which is corrosive and needs additional equipment. Ceramics may have other advantages such as the ability of machining finer pore sizes, or using diamond in the case of passive waste heat removal. Diamond has an extraordinary high thermal conductivity, allowing large amounts of heat to be removed from the semiconductor device 126.

Alternatively, any of the previously described methods of preparing the surfaces including chemical immersions, plasma activations, laser activations, thin film metal depositions, degenerate doping of the semiconductor surface, etc.

may be used individually or in conjunction to obtain the bonding of the two substrates 134 and 136.

Additionally, another variation of the present invention is to bond a semiconductor or ceramic substrate to both sides of a semiconductor device substrate that has a metal layer fabricated onto both its surfaces.

It should be understood that the bonding of a metal substrate to a semiconductor substrate will result in a low thermal resistance across the bonded interface no matter which of the previously described methods are employed.

Therefore, another significant benefit of the bonding method of the present invention is the allowance of the mating of substrates with the purpose of reducing the thermal resistance of the pathway from a power dissipating semiconductor device(s) (e.g., MEMS, electronic, and/or photonic device(s) or some combination thereof) to the metal substrate that the semiconductor devices(s) are mated to and that may be serving as a heat sink, thereby allowing the active device (i.e., MEMS, electronic, and/or photonic device(s)) to be kept at a lower operational temperature for a given power dissipation. Furthermore, the bonding method of the present invention can also be used to make low electrical resistance contacts between a metal substrate material, and a semiconductor substrate material thereby allowing voltage and/or current to be applied to the semiconductor device(s). Yet other significant benefits of the present invention are described, including methods to increase the reliability of semiconductor devices, as well as enabling individual addressability and enhanced operational control of semiconductor devices through the merging of different semiconductor and metal substrates or different material types combined with bonding patterned metal layers on the surfaces of various substrate types. Also, described is a variation of the bonding method of the present invention, whereby material substrates having different thermal expansion coefficients can be bonded successfully, and can be bonded at relatively low temperatures.

While the present invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of bonding together a metal substrate and a semiconductor substrate without the use of any intermediate joining layer between the two substrates, the method comprising the steps of:
polishing a surface of the metal substrate and a surface of the semiconductor substrate so that each surface has a predetermined level of smoothness and a predetermined level of flatness,
cleaning the surface of the metal substrate and the surface of the semiconductor substrate so as to remove from each surface particulates of a predetermined size, contaminants and residues,
bonding together the metal substrate and the semiconductor substrate by contacting the surface of the metal substrate with the surface of the semiconductor substrate.

2. The method of claim 1 further comprising a step of activating the surfaces of the semiconductor and metal substrate prior to physically contacting the surfaces of the substrates.

3. The method of claim 1 further comprising a step of applying a force to the surfaces of the semiconductor and metal substrates during the step of physically contacting the surfaces of the substrates or after the surfaces of the substrates have been physically contacted.

4. The method of claim 1 further comprising a step of annealing the semiconductor and metal substrates for a predetermined period of time and a predetermined elevated temperature to thereby bond the metal substrate and the semiconductor substrate together.

5. The method of claim 1, wherein the predetermined surface smoothness is substantially between two and five Angstroms.

6. The method of claim 1, wherein the predetermined surface smoothness corresponds to a Root-Means-Square ("RMS") surface roughness substantially between 0.5 Angstroms and a several nanometers RMS.

7. The method of claim 1, wherein the step of cleaning the surfaces of the metal and semiconductor substrates is performed by immersing of the metal and semiconductor substrates in a chemical cleaning solution.

8. The method of claim 7, wherein the step of cleaning the semiconductor and metal substrates is followed by the steps of subsequently rinsing the substrates in de-ionized water, followed by spin-rinsing and drying the substrates before physically contacting the substrate surfaces.

9. The method of claim 1, wherein the metal substrate and the semiconductor substrate each have markings on them to allow them to be aligned prior to being bonded together.

10. The method of claim 1, wherein the surface of the metal substrate and the surface of the semiconductor substrate are polished using a chemical-mechanical polishing process.

11. The method of claim 1, wherein the predetermined surface flatness is a surface variation between approximately one to two microns over a substrate area having a diameter of 100 mm or less.

12. The method of claim 1, wherein the step of bonding together the metal substrate and the semiconductor substrate by contacting the surface of the metal substrate with the surface of the semiconductor substrate is performed in a clean environment that is equivalent to a class-10 or better.

13. The method of claim 1, wherein the predetermined surface flatness of the surface of the metal substrate and the surface of the semiconductor substrate is further achieved using planarization of the metal substrate and semiconductor substrate surfaces.

14. The method of claim 10, wherein the slurry used in the chemical-mechanical polishing process is selected according to the types of semiconductor and metal substrates to be bonded together.

15. The method of claim 7, wherein the step of cleaning the surfaces of the metal and semiconductor substrates is performed using a combination of slightly acidic and/or slightly basic solutions combined with physical agitation of the metal and semiconductor substrates.

16. The method of claim 7, wherein the step of cleaning the surfaces of the metal and semiconductor substrates is performed using a solvent solution combined with physical agitation of the metal and semiconductor substrates.

17. The method of claim 7, wherein the step of cleaning the surfaces of the metal and semiconductor substrates further comprises softly brushing the surfaces of the metal and semiconductor substrates without damaging, etching, or roughening said surfaces.

18. The method of claim 7, wherein the step of cleaning the surfaces of the metal and semiconductor substrates further comprises subjecting said substrate surfaces to ultrasonic agitation during the chemical immersion of said substrates without degrading the smoothness of said substrate surfaces.

19. The method of claim 7, wherein the step of cleaning the surfaces of the metal and semiconductor substrates further comprises removing organic residues using a chemical-cleaning agent comprised of a mixture of five parts of de-ionized water to one part each of ammonium hydroxide and hydrogen peroxide.

20. The method of claim 7, wherein the step of cleaning the surfaces of the metal and semiconductor substrates further comprises heating the chemical-cleaning agent to a temperature between 25° C. and 100° C., immersing the metal and semiconductor substrates in the chemical-cleaning agent for approximately 15 minutes, rinsing the metal and semiconductor substrates in de-ionized water, spin-rinsing and then drying the metal and semiconductor substrates before performing the step of contacting the surfaces of the metal and semiconductor substrates.

21. The method of claim 7, wherein the step of cleaning the surfaces of the metal and semiconductor substrates further comprises immersing the metal and semiconductor substrates in a mixture comprised of three parts of sulfuric acid to one part of hydrogen peroxide.

22. The method of claim 21, wherein the step of cleaning the surfaces of the metal and semiconductor substrates further comprises immersing the metal and semiconductor substrates in the acidic mixture for approximately five to fifteen minutes after the mixture forms an exothermic reaction that self-heats up to between 80° C. and 100° C., subsequently rinsing the metal and semiconductor substrates in de-ionized water and then spin-rinsing and drying the metal and semiconductor substrates before performing the step of contacting the surfaces of the metal and semiconductor substrates.

23. The method of claim 2, wherein the step of activating the surfaces of the metal and semiconductor substrates further comprises terminating molecular bonds at the surfaces of the metal and semiconductor substrates dipole molecules so as to increase the bonding strength due to strong dipole-to-dipole attractions across an interface between the surfaces of the metal and semiconductor substrates.

24. The method of claim 4, wherein the step of annealing the metal substrate and the semiconductor substrate is performed at a temperature of at least approximately 200° C. for approximately an hour.

25. The method of claim 4, wherein the step of annealing the metal substrate and the semiconductor substrate is performed at a temperature of at least approximately 400° C. for approximately an hour.

26. The method of claim 4, wherein the step of annealing the metal substrate and the semiconductor substrate is performed at a temperature of at least approximately 600° C. for approximately an hour.

27. The method of claim 4, wherein the step of annealing the metal substrate and the semiconductor substrate is performed at a temperature of at least approximately 800° C. for approximately an hour.

28. The method of claim 4, wherein the step of annealing the metal substrate and the semiconductor substrate is performed at a temperature of at least approximately 1,000° C. for approximately an hour.

29. The method of claim 2, wherein the step of activating the surfaces of the semiconductor and metal substrates to be bonded is performed using wet chemical immersion, exposure to a plasma field, exposure to a laser beam, and/or exposure to an energy source that results in charges being placed onto the surfaces of the substrates.

30. The method of claim 2, wherein the step of activating the surfaces of the semiconductor and metal substrates to be bonded is comprised of exposing the surfaces of the metal and semiconductor substrates to an oxygen plasma, after cleaning and before bonding said surfaces, and wherein the metal and semiconductor substrates are then annealed at a temperature of approximately 400° C. or lower.

31. The method of claim 2, wherein the step of activating the surfaces of the semiconductor and metal substrates to be bonded is comprised of exposing the surfaces of the metal and semiconductor substrates, after cleaning and before bonding, to an oxygen plasma, and wherein the metal and semiconductor substrates are then annealed at a temperature of approximately 200° C. or lower.

32. The method of claim 2, wherein the step of activating the surfaces of the semiconductor and metal substrates to be bonded is comprised of exposing the two substrates, after cleaning and before bonding, to a plasma selected from the group consisting of oxygen, nitrogen and ammonia.

33. The method of claim 1, further comprising the step of applying an electrical potential field across the metal and semiconductor substrates after the substrates have been bonded and during the annealing step.

34. The method of claim 2, wherein the step of activating the surfaces of the semiconductor and metal substrates to be bonded is comprised of applying an electrical charge on one or both of the surfaces of the semiconductor and metal substrates.

35. The method of claim 10, wherein the surface of the metal substrate and the surface of the semiconductor substrate are polished using the chemical-mechanical polishing process in which a slurry composed of abrasives immersed in a chemical etchant solution is applied to the metal and semiconductor substrate surfaces as said surfaces are forced under pressure loading against moving polishing pads.

36. The method of claim 2, wherein the step of activating the surfaces of the semiconductor and metal substrates is comprised of applying an electrical potential field across the metal and semiconductor substrates, and wherein the step of applying the electrical potential field is comprised of placing the substrates on a heating element, applying a force to the substrates and applying the electrodes to the metal and semiconductor substrates to create a voltage potential across said substrates.

37. The method of claim 1, further comprising the step of applying an electrical potential field across the metal and semiconductor substrates after the substrates have been bonded, and wherein the annealing step is not performed.

38. The method of claim 1 further comprising the step of removing from each of the metal and semiconductor substrates native oxides on the surfaces of said substrates to thereby produce a low resistance electrical conduction through an interface between the surfaces of the semiconductor and metal substrates.

39. The method of claim 38 further comprising the step of removing from each of the metal and semiconductor substrates native oxides on the surfaces of said substrates that are at least approximately several Angstroms to approximately several nanometers in thickness.

40. The method of claim 39, wherein the step of removing the native oxides, where the semiconductor substrate is silicon, is comprised of immersing, for less than approximately one minute, the silicon substrate in a solution composed of a dilute hydrofluoric acid in water with a concentration ranging between approximately 10:1 and approximately 50:1.

41. The method of claim 39, wherein the step of removing the native oxides, where the metal substrate is copper or a mixture of predominantly copper and another metal, is comprised of immersing, for several minutes at a temperature of approximately 35° C., the metal substrate in a solution comprised of acetic acid having a concentration of up to 4 vol % water dilution.

42. The method of claim 39, wherein the step of removing the native oxides, where the semiconductor substrate is Gallium Arsenide, is comprised of immersing, for several minutes, the semiconductor substrate in a solution comprised of a ratio of one part $NH_4OH$ to 10 to 20 parts $H_2O$.

43. The method of claim 8, further comprising the step of drying the semiconductor and metal substrates by blowing an inert gas across the surfaces of the semiconductor and metal substrates to thereby remove any liquid from said surfaces or by placing the semiconductor and metal substrates in a vacuum to thereby evaporate any remaining liquids from said surfaces.

44. The method of claim 8, wherein the method further comprises the step of contacting the surfaces of the semiconductor and metal substrates in the presence of an ambient gas to enclose the gas inside any cavities present in the bonded substrates.

45. The method of claim 43, wherein the inert gases are Argon or Nitrogen.

46. The method of claim 44 further comprising the step of contacting the surfaces of the semiconductor and metal substrates in the presence of a vacuum to create a sealed vacuum inside any cavities present in the bonded substrates.

47. The method of claim 29, wherein the method further comprises annealing the bonded substrates in a non-oxidizing ambient gas at an annealing temperature of at least approximately 100° C. for an annealing time of at least approximately 15 minutes.

48. The method of claim 1, wherein the step of joining together the metal substrate and the semiconductor substrate by contacting the surface of the metal substrate with the surface of the semiconductor substrate is performed in a clean environment that is equivalent to a class-100 clean room or better.

49. The method of claim 1, wherein the step of joining together the metal substrate and the semiconductor substrate by contacting the surface of the metal substrate with the surface of the semiconductor substrate is performed in a clean environment that is equivalent to a class-10 clean room or better.

50. The method of claim 1, wherein the step of joining together the metal substrate and the semiconductor substrate by contacting the surface of the metal substrate with the surface of the semiconductor substrate is performed in a clean environment that is equivalent to a class-1 clean room or better.

51. The method of claim 47, wherein the non-oxidizing ambient gas is Nitrogen or Argon.

52. The method of claim 2, wherein the step of activating the surfaces of the metal and semiconductor substrates comprises subjecting said surfaces to a plasma treatment.

53. The method of claim 52, wherein the step of subjecting the metal and semiconductor substrate surfaces to a plasma treatment comprises inserting the metal and semiconductor substrates, after they have been cleaned, into a vacuum chamber having a pressure between approximately 50 mTorr and 250 mTorr, striking a plasma in the chamber using either Nitrogen (N2), Ammonia (NH3), Oxygen (O2), or a combination thereof, and exposing the surfaces of the metal and semiconductor substrates to the plasma for a period of time of approximately less than 1 minute to approximately less than 10 minutes, removing the substrates from the vacuum chamber, whereupon the step of physically contacting the surface of the metal substrate with the surface of the semiconductor substrate is immediately performed, and then the step of annealing the metal substrate and the semiconductor substrate is performed at a temperature between approximately 35° C. and approximately 400° C.

54. The method of claim 2, wherein the step of activating the surfaces of the metal and semiconductor substrates involves immersing the substrates in a de-ionized water or aqueous solution, to thereby allow free radicals to attach to the surfaces and thereby enhance the bonding between the surface of the metal substrate and the surface of the semiconductor substrate, removing the substrates from the solution, rinsing them in Deionized water, followed by a spin rinse and dry, whereupon the step of physically contacting the surface of the metal substrate with the surface of the semiconductor substrate is immediately performed, and then the step of annealing the metal substrate and the semiconductor substrate is performed at a temperature between approximately 35° C. and approximately 400° C.

55. The method of claim 52, wherein the step of subjecting the metal and semiconductor substrate surfaces to a plasma treatment comprises inserting the wafers, after they have been cleaned, into a vacuum chamber with an inside pressure between 2 mTorr and 8 mTorr, striking a plasma in the chamber using a Hydrogen plasma in a ration of approximately 1:1 with Argon, exposing the surfaces of the substrates to the plasma for a period of time between several seconds and 15 minutes, and, without breaking vacuum, taking the substrates to an Ultra-High Vacuum pressure and 600° C. for approximately 2 to 6 minutes to thereby remove hydrogen on the surfaces to leave clean, reactive and hydrophilic surfaces, whereupon the step of physically contacting the surface of the metal substrate with the surface of the semiconductor substrate is immediately performed, and then the step of annealing the metal substrate and the semiconductor substrate is performed at a temperature between approximately 35° C. and approximately 400° C.

56. The method of claim 55, wherein the Ultra-High Vacuum pressure is between approximately $10^{-7}$ Pascals and approximately $10^{-10}$ Pascals.

57. The method of claim 52, wherein the step of subjecting the metal and semiconductor substrate surfaces to a plasma treatment comprises placing the substrates in an Ultra-High Vacuum pressure chamber and heating them to approximately 850 degrees Celsius for approximately 20 to 40 minutes at a pressure of approximately $10^{-9}$ to $10^{-10}$ Pascals, whereupon the step of physically contacting the surface of the metal substrate with the surface of the semiconductor substrate is immediately performed, and then the step of annealing the metal substrate and the semiconductor substrate is performed at a temperature between approximately 35° C. and approximately 400° C.

58. The method of claim 2, wherein the metal and semiconductor substrate surface cleaning, activating and contacting steps are performed in an Ultra-High Vacuum pressure chamber.

59. The method of claim 4, wherein the step of annealing the metal substrate and the semiconductor substrate is performed at a temperature of at least approximately 50° C. to produce a low resistance electrical conductance across an interface between the contacted surfaces of the metal and semiconductor substrates.

60. The method of claim 4, wherein the step of contacting the surface of the metal substrate with the surface of the semiconductor substrate is performed in an Ultra-High Vacuum pressure chamber, and wherein the metal and semiconductor substrates are heated to a temperature of at least approximately 100° C. to produce a low resistance electrical conductance across an interface between the contacted surfaces of the metal and semiconductor substrates.

61. The method of claim 2, further comprising the step of doping the surface of the semiconductor substrate with Boron using either diffusion or ion implantation prior to the cleaning and activating steps being performed to produce a low resistance electrical conductance across an interface between the contacted surfaces of the metal and semiconductor substrates.

62. The method of claim 1, further comprising the steps of depositing a thin film layer of transition metal on the surface of the semiconductor substrate, physically contacting and pressing together the semiconductor and metal substrates using a moderate amount of normal pressure to pre-bond the substrates, and then annealing the pre-bonded substrates at a temperature of between 50° C. and 400° C. to complete the bonding of the semiconductor and metal substrates and thereby produce a low resistance electrical conductance across an interface between the contacted surfaces of the metal substrate and the semiconductor substrate.

63. The method of claim 62, further comprising the steps of cleaning and preparing the semiconductor and metal substrates prior to physically contacting and pressing the substrates together.

64. The method of claim 63, further comprising the steps of cleaning and preparing the semiconductor and metal substrates by immersing said substrates in a cleaning solution.

65. The method of claim 64, wherein the cleaning solution is a weak acidic solution containing either Acetic acid, Hydrochloric acid, Nitric acid, or a mixture of these acids, and wherein the normal pressure is several PSI.

66. The method of claim 64, wherein the cleaning solution for the semiconductor substrate is comprised of a ratio of one part $NH_4OH$ to 10 to 20 parts $H_2O$.

67. The method of claim 62, wherein the transition metal is selected from the group consisting of Palladium, Cobalt, Nickel, Copper, Rhodium, Silver, Iridium, Platinum, Gold and any combination of these metals.

68. The method of claim 1, further comprising the step of degenerately doping the surface of the semiconductor substrate to thereby produce an ohmic contact between the contacted surfaces of the metal and semiconductor substrates.

69. The method of claim 68, further comprising the step of degenerately doping the surface of the semiconductor substrate with Boron using either diffusion or ion implementation.

70. The method of claim 68, wherein the semiconductor substrate is an n-type substrate and wherein the method further comprises the step of degenerately doping the semiconductor substrate with an n-type dopant to thereby produce an ohmic contact between the contacted surfaces of the metal substrate and the semiconductor substrate.

71. The method of claim 68, wherein the semiconductor substrate is a p-type substrate and wherein the method further comprises the step of degenerately doping the semiconductor substrate with a p-type dopant to thereby produce an ohmic contact between the contacted surfaces of the metal substrate and the semiconductor substrate.

72. The method of claim 1, further comprising the step of forming a silicide at the contacted metal and semiconductor substrate surfaces by depositing a transition metal onto the surface of the semiconductor substrate and annealing the semiconductor substrate with the metal deposition to thereby produce an ohmic contact between the contacted surfaces of the metal substrate and the semiconductor substrate.

73. The method of claim 72, wherein the semiconductor substrate is silicon and the transition metal is selected to react with the silicon to form a silicide.

74. The method of claim 72, wherein the semiconductor substrate is Gallium Arsenide and the transition metal is selected to react with the silicon to form a silicide.

75. The method of claim 72, wherein the transition metal is selected from the group consisting of Titanium, Tungsten, Platinum, Aluminum, Aluminum-Silicon and Gold.

76. The method of claim 72, wherein the semiconductor substrate is Germanium and the transition metal is selected from the group consisting of Indium, Gold-Gallium and Gold-Antimony.

77. The method of claim 72, wherein the semiconductor is Gallium Arsenide and the transition metal is selected from the group consisting of Gold-Germanium, Palladium-Germanium, Titanium-Platinum-Gold deposited onto the semiconductor surface prior to bonding to thereby produce an ohmic contact between the semiconductor and metal substrates.

78. The method of claim 2, wherein the surface activating step is comprised of scanning the semiconductor and metal surfaces with a laser immediately prior to physically contacting the semiconductor and metal surfaces.

79. The method of claim 78, wherein the surface activating step is further comprised of scanning the semiconductor surface with a pulsed femto-second laser with a power level that heats, but does not melt, the semiconductor substrate immediately at the semiconductor surface to between approximately 500° C. and 800° C. in a period of time that is less than approximately 100 nanoseconds.

80. The method of claim 79, wherein the laser scanning of the semiconductor surface is performed in a vacuum environment.

81. The method of claim 78, wherein the laser is a gas laser or solid state laser with a wave length extending from infrared to near ultraviolet.

82. The method of claim 78, wherein the semiconductor and metal substrates are physically contacted and annealed after the substrates have been scanned with the femto-second laser.

83. The method of claim 78, wherein the semiconductor and metal substrates are immersed in a solution to allow activation of the surfaces with molecular species after the substrates have been scanned with the femto-second laser.

84. The method of claim 1, wherein the semiconductor and metal substrates are placed in a microwave chamber after being physically contacted and then irradiated with a microwave beam directed at an interface between the semiconductor and metal surfaces from the side of the semiconductor substrate so as to heat an interface between the semiconductor and metal substrates.

85. The method of claim 84, wherein the microwave chamber is evacuated.

86. The method of claim 84, wherein the microwave chamber is filled with a non-reactive gas.

87. The method of claim 84, wherein the semiconductor and metal surfaces are activated using plasma activation or laser activation prior to physically contacting the semiconductor and metal surfaces and irradiating them with the microwave beam.

88. The method of claim 84, wherein the semiconductor surface has Boron diffused or implanted into the semiconductor surface prior to physically contacting the semiconductor surface and the metal surface and irradiating said surfaces with the microwave beam.

89. The method of claim 84, wherein a layer of reactive metal is deposited on the semiconductor surface prior to physically contacting the semiconductor surface and the metal surface and irradiating the two surfaces with the microwave beam.

90. The method of claim 84, wherein a layer of transitional metal is deposited on the semiconductor surface and annealed to form a silicide on the surface prior to physically contacting the semiconductor surface and the metal surface and irradiating the two surfaces with the microwave beam.

91. The method of claim 84, wherein the semiconductor surface is degenerately doped with a dopant selected according to the type of semiconductor material and annealed prior to physically contacting the semiconductor surface and the metal surface and irradiating the two surfaces with the microwave beam.

92. The method of claim 1, wherein the predetermined particulates size is particulates being sub-micron in diameter.

93. A method of bonding together a Gallium Arsenide semiconductor substrate to a metal substrate that functions as a heat sink and as an electrode to supply current to active devices in the Gallium Arsenide semiconductor without the use of any intermediate joining layer between the two substrates, the method comprising the steps of:
lapping and polishing a surface of the semiconductor substrate and a surface of the metal substrate so that each surface has a predetermined level of smoothness and a predetermined level of flatness,
cleaning the surfaces of the semiconductor and metal substrates using suitable solutions for the semiconductor and metal substrates so as to remove from the surfaces of the semiconductor and metal substrates particulates of a predetermined size, contaminants and residues,
removing from the surfaces of the semiconductor and metal substrates any native oxides using appropriate solutions for the semiconductor and metal substrates,
drying the surfaces of the semiconductor and metal substrates and pre-bonding said surfaces together by physically contacting said surfaces together, and
annealing the semiconductor and metal substrates for a predetermined period of time and a predetermined elevated temperature to thereby bond the semiconductor and metal substrates together.

94. The method of claim 93, wherein the step of cleaning the surfaces of the semiconductor and metal substrates comprises the steps of immersing the semiconductor and metal substrates in trichloroethane 1,1,1 for a first period of time between approximately five minutes and approximately 15 minutes, immersing the semiconductor and metal substrates in acetone for a second period of time between approximately five minutes and approximately 15 minutes, immersing the semiconductor and metal substrates in methanol for approximately five minutes and approximately 15 minutes, and immersing the semiconductor and metal substrates in isopropanol for approximately five minutes and approximately 15 minutes.

95. The method of claim 94, wherein solutions used to clean the semiconductor and metal substrates are heated to the boiling point of the respective solutions.

96. The method of claim 93, wherein the step of removing the native oxides comprises the step of immersing the semiconductor substrate in a solution having a mixture of NH4OH and H2O.

97. The method of claim 96, wherein the solution to cleaning the surfaces and remove the native oxide is a mixture of NH4OH and H2O in a proportion between approximately 10:1 and approximately 20:1 for a period of time between approximately 1 minute and approximately 5 minutes under agitation or irrigation.

98. The method of claim 93, wherein the step of cleaning the surfaces and removing the native oxides comprises the step of immersing the semiconductor substrate in a dilute acidic solution having a mixture of HCl and H2O in a proportion of approximately 1:1.

99. The method of claim 93, wherein the step of cleaning the surfaces and removing the native oxides comprises the step of immersing the semiconductor substrate in a dilute acidic solution having a mixture of H3PO4 and H2O in a proportion of approximately 1:1.

100. The method of claim 93, wherein the metal substrate has the native oxides removed from the surface by immersing the metal substrate in a solution of acetic acid (CH3COOH) at a concentration of approximately 4 vol % water dilution or less at 35° C. for approximately several minutes.

101. The method of claim 93, wherein the metal substrate is Copper or has a proportion of its composition made from Copper.

102. The method of claim 93, wherein the semiconductor and metal substrates are subjected to ultrasonic agitation for one or more of the immersion steps.

103. The method of claim 93, wherein the step of drying the surfaces of the semiconductor and metal substrates comprises blowing an inert gas across said surfaces to remove any liquid on said surfaces.

104. The method of claim 93, wherein the step of drying the surfaces of the semiconductor and metal substrates comprises placing the substrates in a vacuum to evaporate any liquids on the surfaces of the substrates.

105. The method of claim 93, wherein the step of pre-bonding the semiconductor and metal substrate surfaces together further comprises compressing the semiconductor and metal substrates together after physically contacting said substrates together.

106. The method of claim 93, wherein the predetermined period of time is approximately at least 5 minutes and wherein the predetermined elevated temperature is approximately at least 50° C.

107. The method of claim 106, wherein the step of annealing the semiconductor and metal substrates is performed in a non-oxidizing ambient gas that is Nitrogen or Argon.

108. The method of claim 93, further comprising the step of activating the surfaces of the semiconductor and metal substrates using plasma activation prior to physically contacting and annealing the semiconductor and metal substrate surfaces.

109. The method of claim 93, further comprising the step of activating the surfaces of the semiconductor and metal substrates using laser activation prior to physically contacting and annealing the semiconductor and metal substrate surfaces.

110. The method of claim 93, wherein Boron is diffused or implanted into the surface of the semiconductor substrate prior to physically contacting and annealing the semiconductor and metal substrate surfaces.

111. The method of claim 93, wherein Palladium or Gold or a combination of the two is deposited as a thin layer on the surface of the semiconductor substrate prior to physically contacting and annealing the semiconductor and metal substrate surfaces.

112. The method of claim 93, wherein the surface of the semiconductor substrate is degenerately doped using a dopant species appropriate for a Gallium Arsenide semiconductor prior to physically contacting and annealing the semiconductor and metal substrate surfaces.

113. The method of claim 93, wherein a thin layer of a transition metal is deposited on the surface of the semiconductor substrate to form a silicide on the surface of the semiconductor substrate surface prior to physically contacting and annealing the semiconductor and metal substrate surfaces.

114. The method of claim 1, wherein the semiconductor substrate is bonded to at least one second semiconductor substrate prior to bonding of the semiconductor substrate to the metal substrate.

115. The method of claim 1, wherein the semiconductor substrate is bonded to metal substrate and then this composite bonded semiconductor to metal substrate pair is bonded to one or more additional semiconductor substrates.

116. The method of claim 1, wherein a multiplicity of semiconductor substrates are bonded to one or more metal substrates.

117. The method of claim 1, wherein the semiconductor substrate is bonded to second and third semiconductor substrates prior to bonding of the semiconductor substrate to the metal substrate, and wherein the semiconductor substrates include microelectronic, photonic and/or MEMS devices fabricated into them.

118. The method of claim 1, wherein the metal substrate has a ceramic enclosure formed on it and wherein the semiconductor substrate has microelectronic, photonic and/or MEMS devices fabricated on it, and wherein the semiconductor substrate is bonded to the metal substrate within the ceramic enclosure and the ceramic enclosure is sealed to completely encapsulate the semiconductor substrate after the semiconductor substrate has been bonded to the metal substrate.

119. The method of claim 1, wherein the metal substrate is a thin, metal layer fabricated on a second semiconductor or ceramic substrate, and wherein the semiconductor substrate includes microelectronic, photonic and/or MEMS devices fabricated into it and is bonded to the metal substrate after the metal substrate has been fabricated on the second semiconductor or ceramic substrate.

120. The method of claim 119, wherein the metal layer functions as an active or passive heat sink to remove waste heat from the semiconductor substrate.

121. The method of claim 120, wherein the metal heat sink to remove waste heat from the semiconductor substrate is composed of a heat pipe, a capillary pumped loop, a microchannel cooler with liquid forced through its internal passages, a spray cooler wherein liquid is sprayed against the hot surfaces, or some other single phase or two phase liquid cooling mechanism.

122. The method of claim 1, wherein the metal substrate is a thin, metal layer fabricated on a second semiconductor substrate that includes microelectronic, photonic and/or MEMS devices fabricated into it, and wherein the metal substrate is bonded to the semiconductor substrate.

123. The method of claim 122, wherein the metal layer functions as electrodes that enable power to be delivered to any devices on the second semiconductor substrate.

124. The method of claim 122, wherein a ceramic substrate is substituted for the semiconductor substrate.

125. A method of bonding together a metal substrate and a semiconductor substrate without the use of any intermediate joining layer between the two substrates, the method comprising the steps of:
polishing a surface of the metal substrate and a surface of the semiconductor substrate using a chemical-mechanical polishing process so that each surface has a predetermined level of smoothness and a predetermined level of flatness,
cleaning the surface of the metal substrate and the surface of the semiconductor substrate using one or more appropriate cleaning solutions and physical agitation of the metal and semiconductor substrates so as to remove from each surface particulates of a predetermined size, contaminants and residues,
activating the surface of the metal substrate and the surface of the semiconductor substrate by subjecting said surfaces to a plasma treatment or by scanning the said surfaces with a laser,
pre-bonding together the metal substrate and the semiconductor substrate by contacting the surface of the metal substrate with the surface of the semiconductor substrate in a clean environment and applying a force to the metal substrate and the semiconductor substrate, and
annealing the metal substrate and the semiconductor substrate for a predetermined period of time and a predetermined elevated temperature to thereby bond the metal substrate and the semiconductor substrate together.

126. The method of claim 125, wherein the predetermined surface smoothness is substantially between 1 Angstroms and several nanometers.

127. The method of claim 125, wherein the predetermined surface flatness is a surface variation between approximately one to two microns over a substrate area having a diameter of 100 mm or less.

128. The method of claim 125, wherein the predetermined particulates size is particulates being sub-micron in diameter.

129. The method of claim 125, wherein the step of cleaning the surface of the metal substrate and the surface of the semiconductor substrate is performed by immersing of the metal substrate and the semiconductor substrate in a chemical cleaning solution.

130. The method of claim 125 comprising further comprising the step of removing from each of the metal and semiconductor substrates native oxides on the surfaces of said substrates to thereby produce a low resistance electrical conduction through an interface between the surfaces of the semiconductor and metal substrates.

131. The method of claim 125, wherein Boron is diffused or implanted into the surface of the semiconductor substrate prior to physically contacting and annealing the semiconductor and metal substrate surfaces to form a low electrical resistance across the bonded interface.

132. The method of claim 125, wherein Palladium or Gold or a combination of the two is deposited on the surface of the semiconductor substrate prior to physically contacting and annealing the semiconductor and metal substrate surfaces to form a low electrical resistance across the bonded interface.

133. The method of claim 125, wherein the surface of the semiconductor substrate is degenerately doped using a dopant species appropriate for the semiconductor substrate prior to physically contacting and annealing the semiconductor and metal substrate surfaces to form a low electrical resistance across the bonded interface.

134. The method of claim 125, wherein a thin layer of a transition metal is deposited on the surface of the semiconductor substrate prior to physically contacting and annealing the semiconductor and metal substrate surfaces to form a low electrical resistance across the bonded interface.

135. The method of claim 125, wherein the semiconductor substrate includes microelectronic, photonic and/or MEMS devices fabricated into it.

136. The method of claim 125, wherein the metal substrate functions as an active or passive heat sink to remove waste heat from the semiconductor substrate.

137. The method of claim 136, wherein the metal heat sink to remove waste heat from the semiconductor substrate is composed of a heat pipe, a capillary pumped loop, a microchannel cooler with liquid forced through its internal passages, a spray cooler wherein liquid is sprayed against the hot surfaces, or some other single phase or two phase liquid cooling mechanism.

138. The method of claim 134, wherein the metal layer functions as electrodes that enable power to be delivered to any devices on the second semiconductor substrate.

139. The method of claim 1, wherein the predetermined surface flatness of the surface of the metal substrate and the surface of the semiconductor substrate is further achieved using lapping of the metal substrate and/or semiconductor substrate surfaces.

140. The method of claim 1, wherein the step of annealing the metal substrate and the semiconductor substrate is performed at a temperature ranging from several degrees above room temperature to over 100° C.

141. The method of claim 1 further comprising exposing the bonded metal and semiconductor substrates to ultrasonic acoustical energy to bond the two substrates together at a low temperature and applied force.

142. The method of claim 1, wherein the metal substrate is a shaped piece of material made from an elemental metal, an alloyed metal made from two or more metal types intermixed in a solid phase state, or a composite metal material made from two or more metal material types brought or pressed together to form a metal composite substrate.

143. The method of claim 4, wherein the annealing step is performed from several degrees above room temperature to over 1000° C. for a time period between several minutes to several hours, depending on the degree that the metal and semiconductor substrate surfaces have been thoroughly smoothed, flattened, cleaned and activated.

144. The method of claim 4, wherein the pre-bonding force is applied simultaneously while the elevated temperature anneal is being performed by the application of heat to the metal and semiconductor substrates during bonding.

145. The method of claim 3, wherein the pre-bonding force that is applied is normal to the surfaces of the metal and/or semiconductor substrate surfaces.

146. The method of claim 3, wherein the pre-bonding force is applied before the elevated temperature anneal is being performed by the application of heat to the metal and semiconductor substrates during bonding.

147. The method of claim 2, wherein the surface activating step is comprised of exposing only the surface of the semiconductor substrate, after cleaning and before bonding, to an oxygen plasma.

148. The method of claim 1, wherein a low resistance electrical conductance across an interface between the bonded semiconductor substrate and a metal substrate is obtained by depositing a thin layer of Palladium or Gold or a combination of the two on the surface of the semiconductor substrate.

149. The method of claim 148, wherein the thin layer of Palladium or Gold or a combination of the two has a thickness between several tens and several thousand Angstroms.

150. The method of claim 1, wherein an ohmic contact between the semiconductor and metal substrates is obtained by depositing a thin metal layer of Palladium, Gold, Gold-Germanium, Palladium-Germanium, or Titanium-Platinum-Gold onto the smaller bandgap semiconductor material prior to bonding of the metal and semiconductor substrates.

151. The method of claim 1, wherein a thin layer of Palladium or Gold or a combination of the two is deposited on the surface of the semiconductor substrate and the metal and semiconductor substrates are then exposed to an ultrasonic acoustical energy beam.

152. The method of claim 151, wherein the semiconductor substrate and the metal and semiconductor substrates are exposed to the ultrasonic acoustical energy beam with the simultaneous application of a normal force and, optionally, heat to the metal and semiconductor substrates to bond said substrates together.

153. A method of bonding together a metal substrate and a semiconductor substrate without the use of any intermediate joining layer between the two substrates, the method comprising the steps of:
  polishing a surface of the metal substrate and a surface of the semiconductor substrate so that each surface has a predetermined level of smoothness and a predetermined level of flatness,
  cleaning the surface of the metal substrate and the surface of the semiconductor substrate so as to remove from each surface particulates of a predetermined size, contaminants and residues,
  pre-bonding together the metal substrate and the semiconductor substrate by contacting the surface of the metal substrate with the surface of the semiconductor substrate,
  applying a force to the metal substrate and the semiconductor substrate while contacting the surface of the metal substrate with the surface of the semiconductor substrate, and
  annealing the metal substrate and the semiconductor substrate for a predetermined period of time and a predetermined elevated temperature to thereby bond the metal substrate and the semiconductor substrate together.

154. The method of claim 153 further comprising activating the surface of the metal substrate and the surface of the semiconductor substrate.

155. The method of claim 153, wherein the predetermined surface flatness of the surface of the metal substrate and the surface of the semiconductor substrate is further achieved using lapping of the metal substrate and/or semiconductor substrate surfaces.

156. The method of claim 153, wherein the predetermined surface smoothness is substantially between two and five Angstroms.

157. The method of claim 153, wherein the predetermined surface smoothness corresponds to a Root-Means-Square ("RMS") surface roughness substantially between 0.5 Angstroms and several nanometers RMS.

158. The method of claim 153, wherein the predetermined surface flatness is a surface variation between approximately one to two microns over a substrate area having a diameter of 100 mm or less.

159. The method of claim 153, wherein the predetermined particulates size is particulates being sub-micron in diameter.

160. The method of claim 153, wherein the predetermined elevated annealing temperature is at least approximately 50° C., and wherein the predetermined period of annealing time is at least approximately 15 minutes.

161. The method of claim 4, wherein the step of annealing the metal substrate and the semiconductor substrate is performed at a temperature of at least approximately 50° C. for approximately an hour.

* * * * *